(12) United States Patent
Yanagisawa

(10) Patent No.: US 10,886,407 B2
(45) Date of Patent: Jan. 5, 2021

(54) SEMICONDUCTOR DEVICE, MANUFACTURING METHOD FOR SEMICONDUCTOR DEVICE, AND ELECTRONIC APPARATUS

(71) Applicant: SONY SEMICONDUCTOR SOLUTIONS CORPORATION, Kanagawa (JP)

(72) Inventor: Yuki Yanagisawa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/466,251

(22) PCT Filed: Nov. 17, 2017

(86) PCT No.: PCT/JP2017/041518
§ 371 (c)(1),
(2) Date: Jun. 3, 2019

(87) PCT Pub. No.: WO2018/116716
PCT Pub. Date: Jun. 28, 2018

(65) Prior Publication Data
US 2020/0066909 A1 Feb. 27, 2020

(30) Foreign Application Priority Data
Dec. 21, 2016 (JP) ................ 2016-248272

(51) Int. Cl.
H01L 29/78 (2006.01)
H01L 27/12 (2006.01)
H01L 21/84 (2006.01)

(52) U.S. Cl.
CPC .......... *H01L 29/7849* (2013.01); *H01L 21/84* (2013.01); *H01L 27/1203* (2013.01)

(58) Field of Classification Search
CPC .. H01L 29/7849; H01L 21/84; H01L 27/1203
(Continued)

(56) References Cited

U.S. PATENT DOCUMENTS 5,643,815 A * 7/1997 Vu ................ H01L 21/823807
257/E21.432
2006/0125008 A1* 6/2006 Chidambarrao .... H01L 29/7843
257/347
(Continued)

FOREIGN PATENT DOCUMENTS

JP 2008-523631 7/2005
JP 2007-189016 7/2007
(Continued)

OTHER PUBLICATIONS

International Search Report prepared by the Japan Patent Office dated Dec. 26, 2017, for International Application No. PCT/JP2017/041518.
(Continued)

*Primary Examiner* — Tong-Ho Kim
(74) *Attorney, Agent, or Firm* — Sheridan Ross P.C.

(57) ABSTRACT

A semiconductor device formed by using an SOI substrate including a substrate, a BOX layer formed on the substrate, and an SOI layer formed on the BOX layer, in which a part of or all of the BOX layer at least in a part of the BOX layer arranged in a non-active area adjacent to an active area has been removed, and the BOX layer in a portion where the SOI layer forming the active area is arranged is configured to remain deformation used to apply stress to the SOI layer.

20 Claims, 21 Drawing Sheets

(58) Field of Classification Search
USPC .......................................................... 257/351
See application file for complete search history.

(56) References Cited

U.S. PATENT DOCUMENTS

| | | |
|---|---|---|
| 2006/0214232 A1* | 9/2006 | Chen ..................... H01L 21/84 |
| | | 257/351 |
| 2007/0010048 A1 | 1/2007 | Chen et al. |
| 2007/0158746 A1 | 7/2007 | Ohguro |
| 2007/0202639 A1 | 8/2007 | Chidambarrao et al. |
| 2011/0156026 A1 | 6/2011 | Yamazaki et al. |
| 2012/0305913 A1 | 12/2012 | Yamazaki et al. |
| 2014/0193946 A1 | 7/2014 | Yamazaki et al. |
| 2015/0118790 A1 | 4/2015 | Yamazaki et al. |

FOREIGN PATENT DOCUMENTS

| | | |
|---|---|---|
| JP | 2008-034406 | 2/2008 |
| JP | 2009-152485 | 7/2009 |
| JP | 2011-199112 | 6/2011 |
| JP | 2011-155249 | 8/2011 |

OTHER PUBLICATIONS

Bonnevialle et al,, "A New Method to Induce Local Tensile Strain in SOI Wafers: First Strain Results of the "BOX Creep" Technique," International Conference on Solid State Devices and Materials, Sapporo, 2015, pp. 1110-1111.

\* cited by examiner

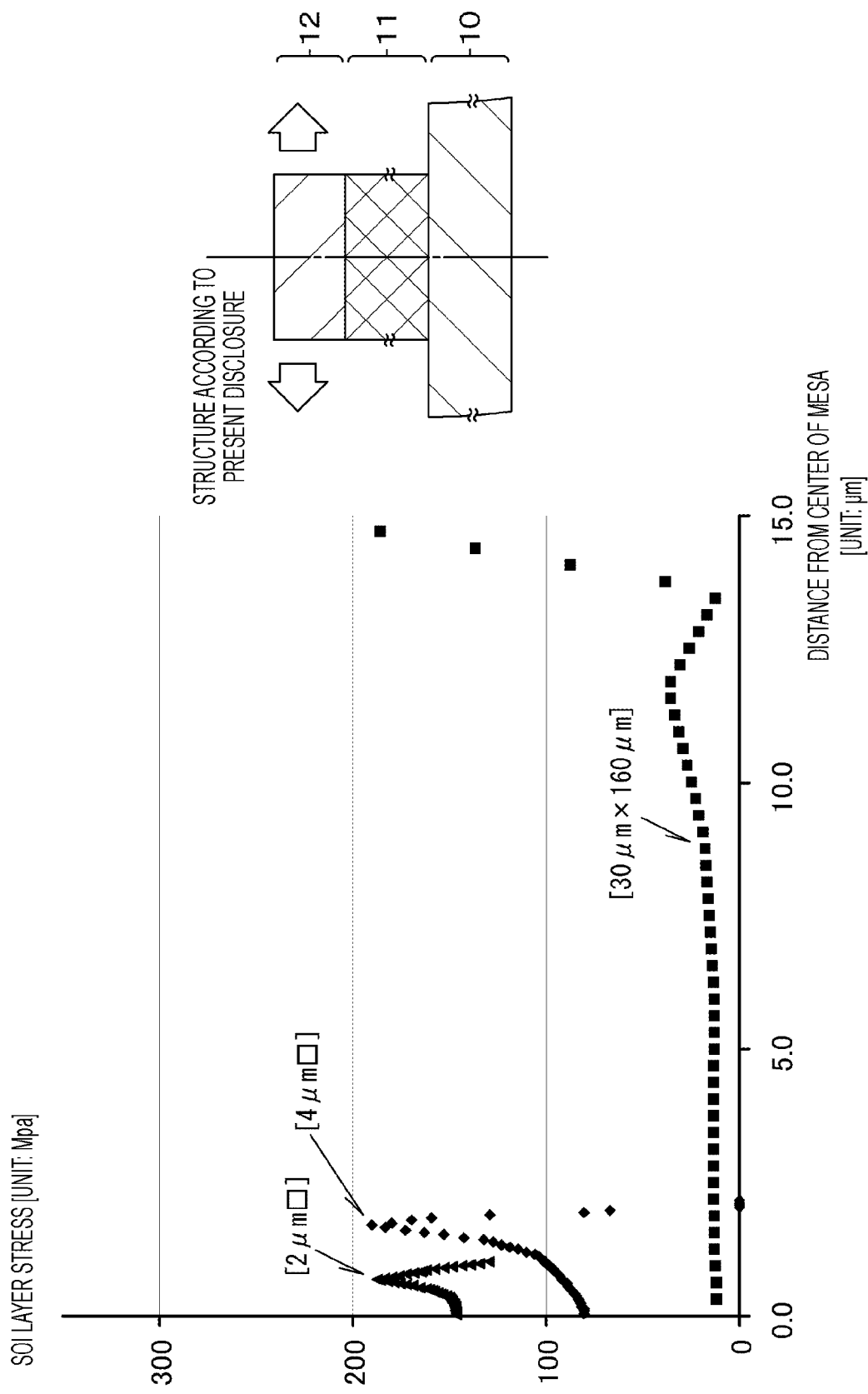

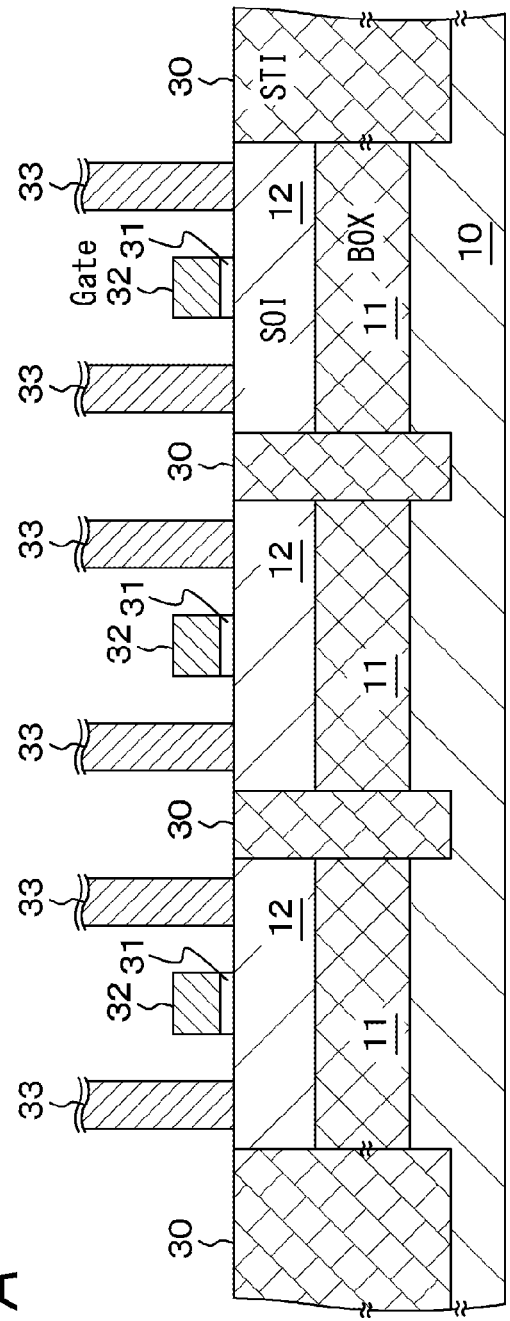
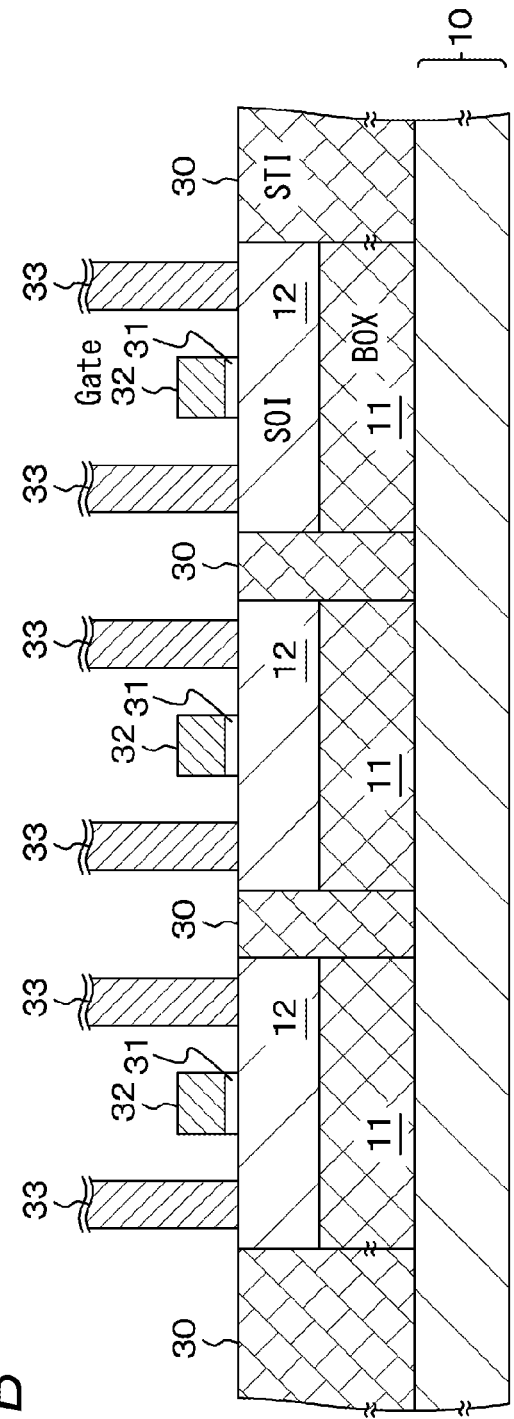
FIG. 21A
FIG. 21B

SEMICONDUCTOR DEVICE, MANUFACTURING METHOD FOR SEMICONDUCTOR DEVICE, AND ELECTRONIC APPARATUS

CROSS REFERENCE TO RELATED APPLICATIONS

This application is a national stage application under 35 U.S.C. 371 and claims the benefit of PCT Application No. PCT/JP2017/041518 having an international filing date of 17 Nov. 2017, which designated the United States, which PCT application claimed the benefit of Japanese Patent Application No. 2016-248272 filed 21 Dec. 2016, the entire disclosures of each of which are incorporated herein by reference.

TECHNICAL FIELD

The present disclosure relates to a semiconductor device, a method for manufacturing a semiconductor device, and an electronic apparatus.

BACKGROUND ART

To improve electrical characteristics of a semiconductor device, it has been proposed to improve a carrier mobility by applying stress to a channel area. As a method for applying the stress to the channel area, a method for forming a base layer using a material having a layer constant different from that of a material forming the channel area and subsequently forming the channel area on the base layer and a method for forming a film (stress film) having stress on a gate electrode and a source-drain area have been proposed. For example, Japanese Patent Application Laid-Open No. 2011-199112 (Patent Document 1) describes that a stress liner film for generating distortion in the channel area is provided on a transistor having the channel area.

Furthermore, in a semiconductor device using a Silicon on Insulator (SOI) substrate, a method has been proposed for applying the stress to a Top Si layer (SOI layer) on a Buried Oxide layer (BOX layer) by remaining deformation caused by a creep phenomenon in the BOX layer (for example, refer to Non-Patent Document 1). This is a method for depositing a SiN film having film stress on the SOI layer, generating deformation caused by a creep on the BOX layer by executing high annealing, and applying stress on the SOI layer after the SiN film has been removed.

CITATION LIST

Patent Document

Patent Document 1: Japanese Patent Application Laid-Open No. 2011-199112
Non-Patent Document 1: A. Bonnevialle et al., "A New Method to Induce Local Tensile Strain in SOI Wafers: First Strain Results of the" BOX CREEP "Technique", Extended Abstracts of the 2015 International Conference on Solid State Devices and Materials, Sapporo, 2015, pp 1110-1111, STMicroelectronics

SUMMARY OF THE INVENTION

Problems to be Solved by the Invention

The method for remaining the deformation caused by the creep in the BOX layer of the SOI substrate has an advantage such that the stress can be applied to the entire channel area. However, to further improve the carrier mobility, development in a structure and a method for increasing the degree of the deformation remaining in the BOX layer has been required.

Accordingly, an object of the present disclosure is to provide a semiconductor device capable of increasing a degree of deformation remaining in a BOX layer, a method for manufacturing the semiconductor device, and an electronic apparatus including the semiconductor device.

Solutions to Problems

A semiconductor device according to a first aspect of the present disclosure to achieve the above object is a semiconductor device formed by using an SOI substrate including a substrate, a BOX layer formed on the substrate, and an SOI layer formed on the BOX layer, in which a part of or all of the BOX layer in at least a part of the BOX layer arranged in a non-active area adjacent to an active area has been removed, and the BOX layer in a portion where the SOI layer forming the active area is arranged is configured to remain deformation used to apply stress to the SOI layer.

A method for manufacturing a semiconductor device according to the first aspect of the present disclosure is a method for manufacturing a semiconductor device formed by using an SOI substrate including a substrate, a BOX layer formed on the substrate, and an SOI layer formed on the BOX layer, including processes for forming a stress film on the SOI layer, subsequently removing the stress film and the SOI layer positioned in a non-active area adjacent to an active area, subsequently removing a part or all of the BOX layer in at least a part of the BOX layer arranged in the non-active area adjacent to the active area, subsequently removing the stress film after high-temperature annealing processing is executed on the entire SOI substrate to generate a creep in the BOX layer by the stress of the stress film so as to remain deformation caused by the creep in the BOX layer.

An electronic apparatus according to the first aspect of the present disclosure to achieve the above object is an electronic apparatus including a semiconductor device formed by using an SOI substrate including a substrate, a BOX layer formed on the substrate, and an SOI layer formed on the BOX layer, in which a part of or all of the BOX layer in at least a part of the BOX layer arranged in the non-active area adjacent to the active area has been removed, and the BOX layer in a portion where the SOI layer forming the active area is arranged is configured to remain deformation used to apply stress to the SOI layer.

Effects of the Invention

In a semiconductor device according to the present disclosure, a part or all of a BOX layer has been removed in at least a part of the BOX layer arranged in a non-active area adjacent to an active area. With this structure, since deformation for applying stress to the SOI layer easily remains in the BOX layer in a portion where the SOI layer forming the active area is arranged, a carrier mobility can be further improved.

BRIEF DESCRIPTION OF DRAWINGS

FIG. 9 is a graph of a stress simulation for explaining a stress difference of the SOI layers caused by the difference in the mesa structure.

FIG. 17 is a graph of a stress simulation for explaining a relationship between the stress of the SOI layer and an area of the mesa structure.

FIG. 19A corresponds to FIG. 16B, and FIG. 19B corresponds to FIG. 18B.

FIGS. 21A and 21B are schematic cross-sectional views for explaining a structure of a semiconductor device in which a configuration in which the entire BOX layer has been removed and a part of the top portion of the substrate has been further removed and other configuration mixedly exist. FIG. 21A corresponds to FIG. 20B, and FIG. 21B corresponds to FIG. 16B.

MODE FOR CARRYING OUT THE INVENTION

Figure 1A:
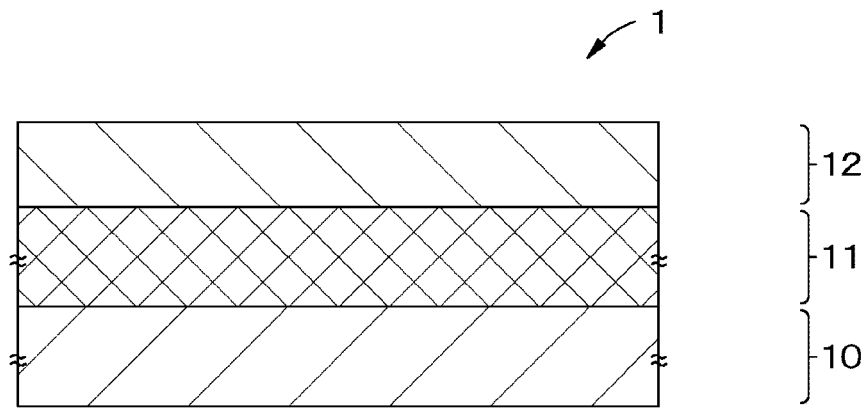
FIGS. 1A to 1C are schematic diagrams for explaining deformation caused by high-temperature annealing processing in a case where a stress film having compression stress is formed.

Hereinafter, the present disclosure will be described on a basis of an embodiment with reference to the drawings. The present disclosure is not limited to the embodiment, and various values and materials in the embodiment are only exemplary. In the following description, the same elements or elements having the same functions are denoted with the same reference numeral, and overlapped description is omitted. Note that the description will be made in the following order.

1. General description on a semiconductor device, a method for manufacturing a semiconductor device, and an electronic apparatus according to the present disclosure
2. First embodiment
3. Others

[General Description on a Semiconductor Device, a Method for Manufacturing a Semiconductor Device, and an Electronic Apparatus According to the Present Disclosure]

In a semiconductor device according to the present disclosure, an electronic apparatus using the semiconductor device, and a semiconductor device manufactured by a method for manufacturing the semiconductor device according to the present disclosure (hereinafter, these may be simply referred to as the present disclosure), a BOX layer positioned in a non-active area can have a structure including a plurality of areas having different thicknesses.

In the present disclosure including the preferred configuration, a configuration can be used in which, in at least a part of a substrate surface positioned in an area formed by removing the entire BOX layer, a part of the substrate is removed. In this case, each of the BOX layer and the substrate positioned in the non-active area can have a configuration including a plurality of areas having different thicknesses.

In the present disclosure including various preferred configurations, a configuration can be used in which stress for extending a crystal lattice is applied to an SOI layer in the active area forming an nMOS type transistor. Furthermore, a structure can be used in which stress for narrowing the crystal lattice is applied to the SOI layer in the active area forming a pMOS type transistor.

In the present disclosure including the various preferred configurations, the semiconductor device includes the active area forming the nMOS type transistor and the active area forming the pMOS type transistor, and can have a configuration in which a thickness of the BOX layer positioned in the non-active area adjacent to the active area forming the nMOS type transistor is different from a thickness of the BOX layer positioned in the non-active area adjacent to the active area forming the pMOS type transistor.

In this case, in at least a part of the substrate surface positioned in the area formed by removing the entire BOX layer, a part of the substrate is removed, and the structure can be used in which a thickness of the substrate positioned in the non-active area adjacent to the active area forming the nMOS type transistor is different from a thickness of the substrate positioned in the non-active area adjacent to the active area forming the pMOS type transistor.

In the present disclosure including the various preferred configurations, a configuration can be used in which a difference between the thickness of the BOX layer positioned in the active area and the thickness of the BOX layer positioned in the non-active area adjacent to the active area is equal to or more than 50 nanometers. Alternatively, a configuration can be used in which the entire BOX layer arranged in the non-active area adjacent to the active area has been removed.

In the present disclosure including the various preferred configurations has an aspect in which the BOX layer in a portion where the SOI layer forming the active area is arranged is configured so that deformation caused by a creep generated by high-temperature annealing processing executed on the SOI substrate remains.

The semiconductor device according to the present disclosure including the various preferred configurations can have a configuration in which stress over 100 Mpa at a normal temperature is applied to the SOI layer on the BOX layer in the active area.

In the present disclosure including the various preferred configurations, a configuration can be used in which the thickness of the SOI layer in the active area is equal to or less than 200 nanometers.

In the present disclosure including the various preferred configurations, a configuration can be used in which the thickness of the SOI layer in the active area is equal to or less than 200 nanometers.

In the present disclosure including the various preferred configurations, a configuration can be used in which an element separation insulating layer is provided to cover the entire non-active area including the BOX layer.

As described above, the method for manufacturing the semiconductor device according to the present disclosure is a method for manufacturing the semiconductor device formed by using the SOI substrate including the substrate, the BOX layer formed on the substrate, and the SOI layer formed on the BOX layer, which includes processes for forming a stress film on the SOI layer, subsequently removing the stress film and the SOI layer positioned in the non-active area adjacent to the active area, subsequently removing a part or all of the BOX layer in at least a part of the BOX layer arranged in the non-active area adjacent to the active area, subsequently removing the stress film after the high-temperature annealing processing is executed on the entire SOI substrate to generate the creep in the BOX layer by the stress of the stress film so as to remain the deformation caused by the creep in the BOX layer.

In this case, a configuration can be used further including a process for removing a part of the substrate in at least a part of the substrate surface positioned in the area where the entire BOX layer has been removed.

In the method for manufacturing the semiconductor device according to the present disclosure including the preferred configuration, a stress film having compression stress can be formed on the SOI layer in the active area forming the nMOS type transistor, and a stress film having tensile stress can be formed on the SOI layer in the active area forming the pMOS type transistor.

As described above, an electronic apparatus according to the present disclosure is an electronic apparatus including a semiconductor device formed by using an SOI substrate including a substrate, a BOX layer formed on the substrate, and an SOI layer formed on the BOX layer, in which a part of or all of the BOX layer in at least a part of the BOX layer arranged in the non-active area adjacent to the active area has been removed, and the BOX layer in a portion where the SOI layer forming the active area is arranged is configured to remain the deformation used to apply the stress to the SOI layer.

In this case, a configuration can be used in which the electronic apparatus can be a display, an image sensor, a memory, an RF switch, a power amplifier, a low noise amplifier, or the like.

The configuration of the SOI substrate such as an SOI wafer used in the present disclosure is not particularly limited as long as the SOI substrate does not prevent implementation of the present disclosure. For example, the SOI substrate can be formed by a method for forming an oxide film on at least one of a support substrate or an active substrate, subsequently bonding the oxide film to one of the support substrate and the active substrate, and subsequently polishing the active substrate to a predetermined thickness.

A material forming the stress film is not particularly limited as long as a predetermined stress is held at the time of the high-temperature annealing processing. More specifically, it is sufficient that the material have the stress and rigidity higher than those of the SOI layer and the BOX layer.

As the material forming the stress film, for example, silicon nitride ($SiN_x$) can be exemplified. A film including silicon nitride can be formed by a known method, for example, a CVD method or the like. A direction and a magnitude of the stress can be controlled by a type of a film formation method, atmosphere at the time of forming the film, exposure by energy rays, setting of a hydrogen density in the film, and the like. For example, a film having compression stress can be formed by Plasma Enhanced Chemical Vapor Deposition (PECVD), or a film having tensile stress can be formed by Low Pressure Chemical Vapor Deposition (LPCVD). Stress values in various films and layers can be measured by strain measurement by the Raman spectroscopy and the Nano Beam Diffraction (NBD) method using TEM.

From the viewpoint of causing the deformation by the creep, basically, it is preferable to execute the high-temperature annealing processing at a temperature equal to or higher than about a half of an absolute temperature of a melting point of the material forming the BOX layer. Specifically, it is preferable that the high-temperature annealing processing be executed at a temperature equal to or higher than 1100° C., more preferably, at a temperature equal to or higher than 1200° C. Qualitatively, a degree of the deformation due to a creep increases as the processing time for high-temperature annealing processing increases and increases as the temperature at which high-temperature annealing treatment is performed increases.

Various conditions herein are satisfied in a case where the conditions are substantially satisfied, in addition to a case where the conditions are strictly satisfied. Various variations caused by design or manufacturing are allowed. Furthermore, the drawings used in the following description are schematic and do not indicate actual dimensions and ratios of the dimensions.

First Embodiment

A first embodiment relates to a semiconductor device, a method for manufacturing a semiconductor device, and an electronic apparatus according to a first aspect of the present disclosure.

To facilitate understanding of the present disclosure, deformation at the time when high-temperature annealing processing is executed in a state where a stress film is formed on an SOI layer will be described first.

Figure 1B:
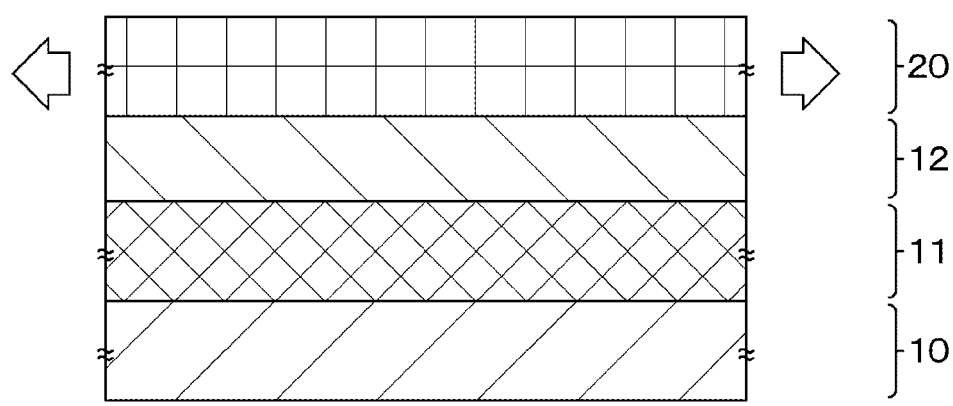
Figure 1C:
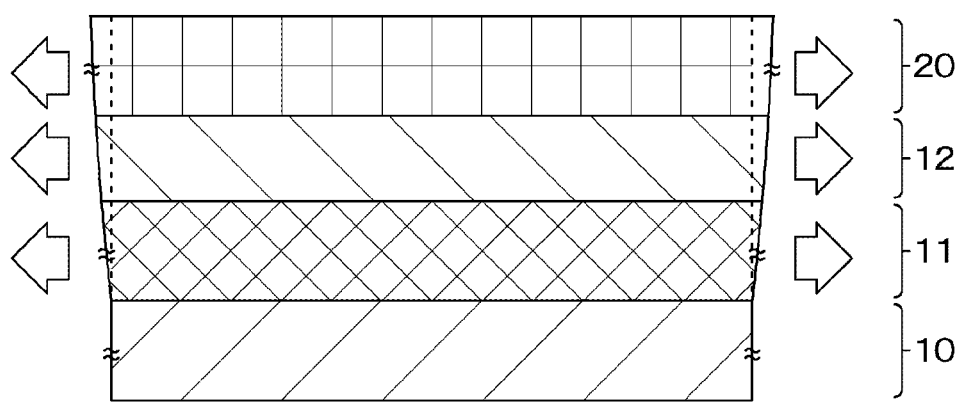
Figure 2A:
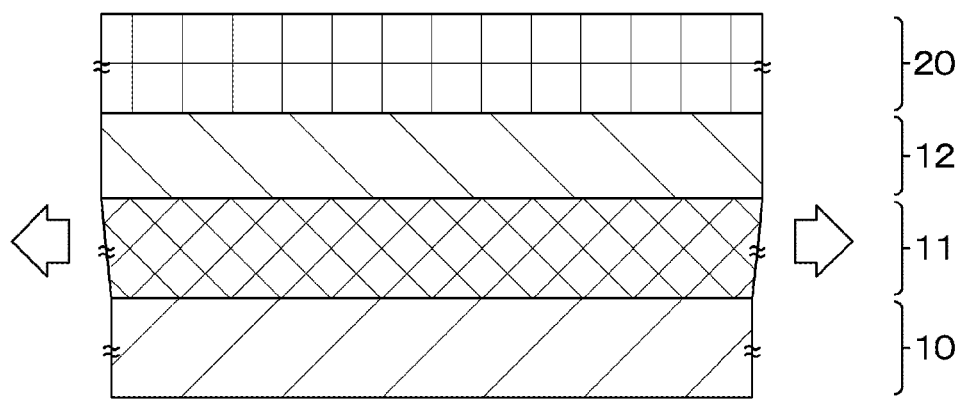
FIGS. 2A and 2B are schematic diagrams for explaining the deformation caused by the high-temperature annealing processing in a case where the stress film having the compression stress is formed, subsequent to FIG. 1C.
Figure 2B:
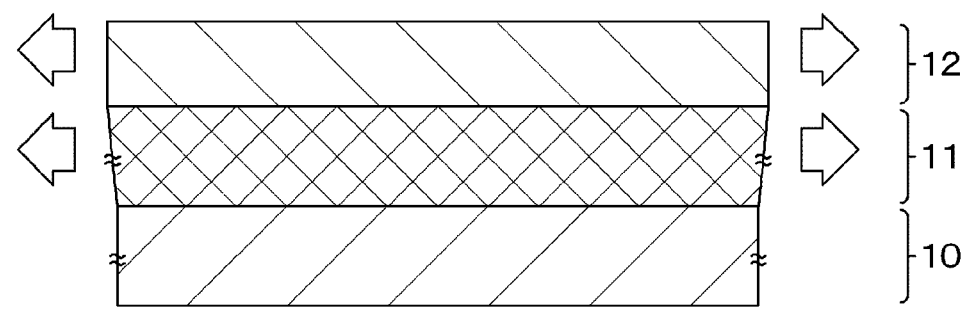

FIGS. 1A to 1C are schematic diagrams for explaining the deformation caused by the high-temperature annealing processing in a case where a stress film having compression stress is formed. FIGS. 2A and 2B are schematic diagrams for explaining the deformation caused by the high-temperature annealing processing in a case where the stress film having the compression stress is formed, subsequent to FIG. 1C.

FIG. 1A illustrates a cross section of an SOI substrate 1. The SOI substrate 1 includes a substrate 10 including, for example, silicon, a BOX layer 11 formed on the substrate 10, and an SOI layer 12 formed on the BOX layer 11.

FIG. 1B illustrates a state where the stress film is formed on the SOI layer. A stress film 20 includes, for example, silicon nitride. Here, description will be made as assuming that the stress film 20 has compression stress for an nMOS type. The stress film 20 having the compression stress exhibits a property for expanding outward. Therefore, a force expanding outward acts on the SOI layer 12 under the stress film 20.

FIG. 1C schematically illustrates the deformation at the time when the high-temperature annealing processing is executed on the SOI substrate on which the stress film is formed.

Basically, even when a force smaller than a yield weight acts on an object, deformation of the object does not remain. However, if the object is exposed in high-temperature environment in a state where the force is applied to the object, a phenomenon such that the deformation of the object occurs and remains as time elapses, in other words, a so-called creep phenomenon occurs.

On the SOI substrate 1 on which the stress film 20 is formed, for example, annealing processing is executed under, for example, a condition such as for two minutes at a temperature of 1200° C. Generally, in the high-temperature environment in which a temperature exceeds a half of an absolute value of a melting point of a material, the deformation caused by the creep easily occurs. Since a melting point of silicon oxide forming the BOX layer 11 is about 1800° C., the BOX layer 11 is deformed by the creep by being pulled by the SOI layer 12.

FIG. 2A schematically illustrates an SOI substrate in a state where a temperature of the SOI substrate is returned to a normal temperature after the high-temperature annealing processing. FIG. 2B illustrates a state where the stress film has been further removed.

In a state where the temperature is returned to the normal temperature, the deformation caused by the creep remains in the BOX layer 11. Normally, when the stress film 20 is removed, the stress to the SOI layer 12 is relaxed. However, the deformation caused by the creep remains in the BOX layer 11. Therefore, a force in a direction for extending outward, in other words, a direction expanding a crystal lattice of the SOI layer 12 acts on the SOI layer 12 on the BOX layer 11.

The above example has been described as assuming that the stress film 20 have the compression stress. In a case where the stress film 20 has the tensile stress, the BOX layer 11 is deformed in an inward direction. As a result, a force in the inward direction, in other words, a direction for narrowing the crystal lattice of the SOI layer 12 acts on the SOI layer 12 on the BOX layer 11.

Next, the high-temperature annealing processing in the configuration in which the mesa structure is provided within the SOI layer disclosed in Non-cited Document 1 will be described.

Figure 3A:
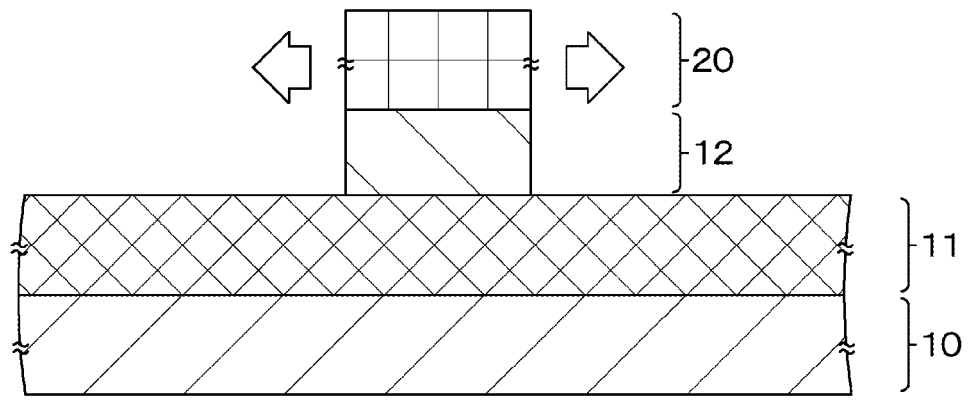
FIGS. 3A to 3C are schematic diagrams for explaining deformation caused by the high-temperature annealing processing in a configuration in which a mesa structure is provided within an SOI layer.
Figure 3B:
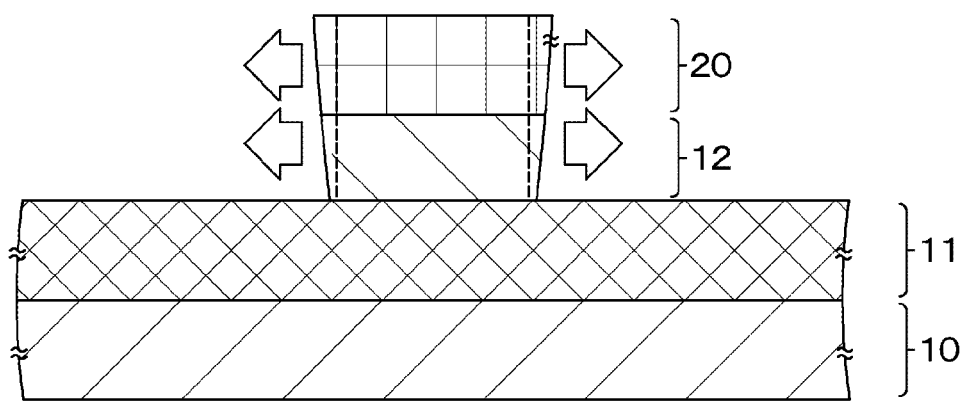
Figure 3C:
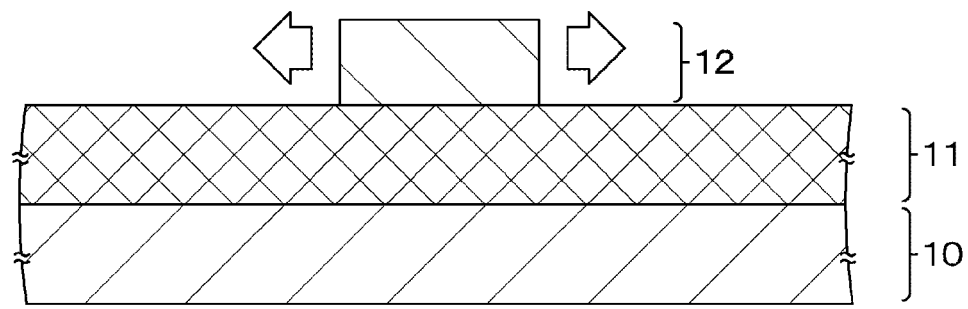

FIGS. 3A to 3C are schematic diagrams for explaining the deformation caused by the high-temperature annealing processing in a configuration in which the mesa structure is provided within the SOI layer.

FIG. 3A illustrates a state where the mesa structure is formed by patterning the stress film and the SOI layer by using the SOI substrate on which the stress film is formed. The substrate 10 and the BOX layer 11 are not patterned. Note that, for convenience of description, the description will be made as assuming that the stress film 20 have compression stress. However, the present disclosure is not limited to this. The same applied to FIG. 4 as described later.

The deformation caused when the high-temperature annealing processing is executed on the mesa structure illustrated in FIG. 3A is schematically illustrated in FIG. 3B. Thereafter, a state where the stress film has been removed in a state where the temperature has been returned to the normal temperature is illustrated in FIG. 3C.

The BOX layer 11 is restricted by the substrate 10 with higher rigidity. Therefore, even when the BOX layer 11 is softened by the high-temperature annealing processing, a degree of the deformation is suppressed by an influence of the substrate 10 (refer to FIG. 3B).

When the temperature is returned to the normal temperature, the deformation caused by the high-temperature annealing processing remains in the BOX layer 11. Therefore, even in a state where the stress film 20 is removed, the force acts in the direction for expanding the crystal lattice acts on the SOI layer 12 due to the deformation remaining in the BOX layer 11 (refer to FIG. 3C). However, since the degree of the deformation remaining in the BOX layer 11 is suppressed, an action of the force on the SOI layer 12 is suppressed to some extent.

Therefore, in the present disclosure, to facilitate the deformation of the BOX layer caused by the high-temperature annealing processing, the mesa structure is extended to the BOX layer.

Figure 4A:
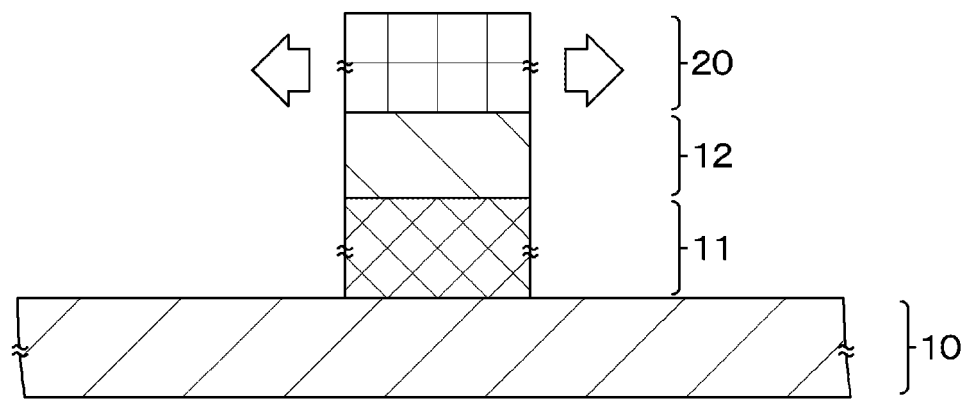
FIGS. 4A to 4C are schematic diagrams for explaining deformation caused by the high-temperature annealing processing in a configuration in which the mesa structure extended to a BOX layer.
Figure 4B:
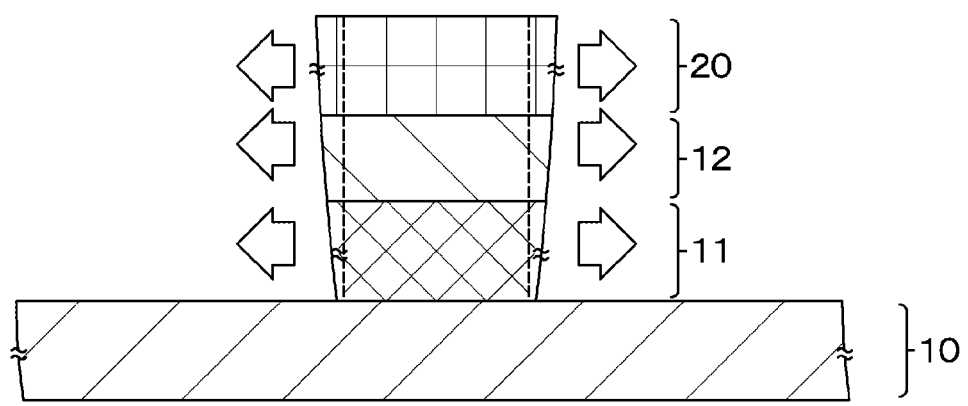
Figure 4C:
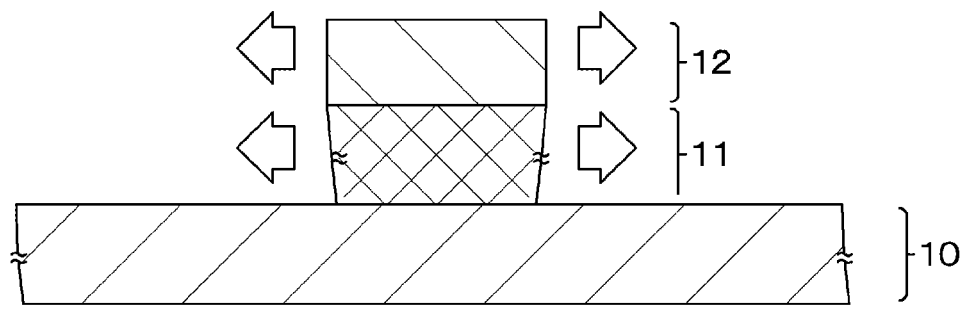

FIGS. 4A to 4C are schematic diagrams for explaining the deformation caused by the high-temperature annealing processing in a configuration in which the mesa structure is extended to the BOX layer.

FIG. 4A illustrates a state where the mesa structure is formed by patterning the stress film, the SOI layer, and the BOX layer by using the SOI substrate on which the stress film is formed. The substrate 10 is not patterned. Note that, for convenience of description, the description will be made as assuming that the stress film 20 have compression stress. However, the present disclosure is not limited to this.

The deformation caused when the high-temperature annealing processing is executed on the mesa structure illustrated in FIG. 4A is schematically illustrated in FIG. 4B. Thereafter, a state where the stress film 20 has been removed in a state where the temperature has been returned to the normal temperature is illustrated in FIG. 4C.

In the structure illustrated in FIG. 4A, the BOX layer 11 is subdivided. Therefore, in the BOX layer 11 having the mesa structure, a degree of the restriction of the substrate 10 is relaxed, and a volume to which the force of the stress film 20 is applied decreases. This facilitates the deformation of the BOX layer 11 caused by the high-temperature annealing processing (refer to FIG. 4B).

When the temperature is returned to the normal temperature, the deformation caused by the high-temperature annealing processing remains in the BOX layer 11. In this way, the BOX layer 11 in a portion where the SOI layer 12 forming an active area is arranged is configured so that the deformation caused by the creep generated by the high-temperature annealing processing executed on the SOI substrate 1 remains. Furthermore, since the deformation of the BOX layer 11 caused by the high-temperature annealing processing is facilitated, an action of a force to the SOI layer 12 increases, and a force acts on the SOI layer 12 in a direction for expanding the crystal lattice. (refer to FIG. 4O).

Figure 5:
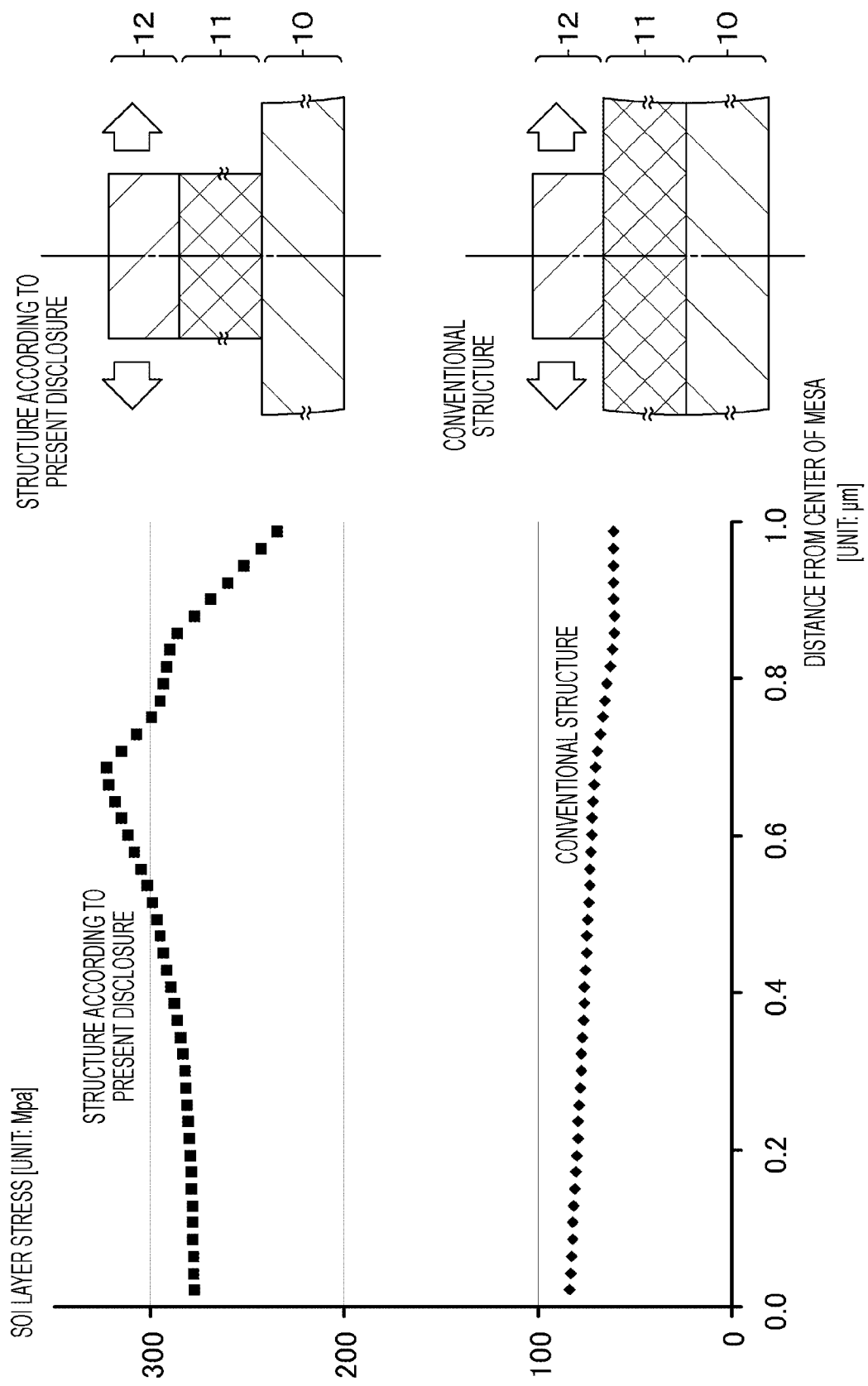
FIG. 5 is a graph of a stress simulation for explaining a stress difference of the SOI layers caused by the difference in the mesa structure.

FIG. 5 is a graph in which stresses in the SOI layer are compared with each other regarding a configuration in which the mesa structure is provided within the SOI layer (may be referred to as conventional structure) and a configuration in which the mesa structure is extended to the BOX layer (structure according to the present disclosure) are compared with each other.

In both configurations, the SOI substrate 1 has the same specification. A thickness of the SOI layer 12 is 30 nanometers, a thickness of the BOX layer 11 is 400 nanometers, and the mesa structure has a rectangular shape of which a length of one side is two micrometers. The condition of the high-temperature annealing processing includes a temperature of 1200° C. for ten minutes. The stress of the SOI layer 12 is stress in a state where the stress film 20 has been removed after the high-temperature annealing processing. A horizontal axis of the graph indicates a distance from the center of the mesa structure, and a vertical axis of the graph indicates the stress of the SOI layer 12. This similarly applies to other graphs as described later.

As apparent from the graph, the stress of the SOI layer 12 in the structure according to the present disclosure is a value equal to or more than three times of the stress of the SOI layer 12 in a conventional structure. Therefore, stress over 100 MPa at the normal temperature can be applied to the SOI layer 12 on the BOX layer 11 in the active area, mobility of electrons in the SOI layer 12 is further improved. If an nMOS type transistor is formed, it is expected that an effect of reducing an on-resistance $R_{on}$ between a drain and a source excluding a wiring resistance and a contact resistance of a contact is equal to or more than three times of that in the conventional structure.

In this way, a configuration can be used in which the stress for extending the crystal lattice is applied to the SOI layer 12 in the active area forming the nMOS type transistor.

In a case where a pMOS type transistor is formed, it is preferable that the force acts on the SOI layer 12 in a direction for narrowing the crystal lattice. Therefore, if the pMOS type transistor is formed, it is preferable to form the stress film 20 having the tensile stress and performing a similar process to the process described above. In this way, a configuration can be used in which the stress for narrowing the crystal lattice is applied to the SOI layer 12 in the active area forming the pMOS type transistor.

Figure 6:
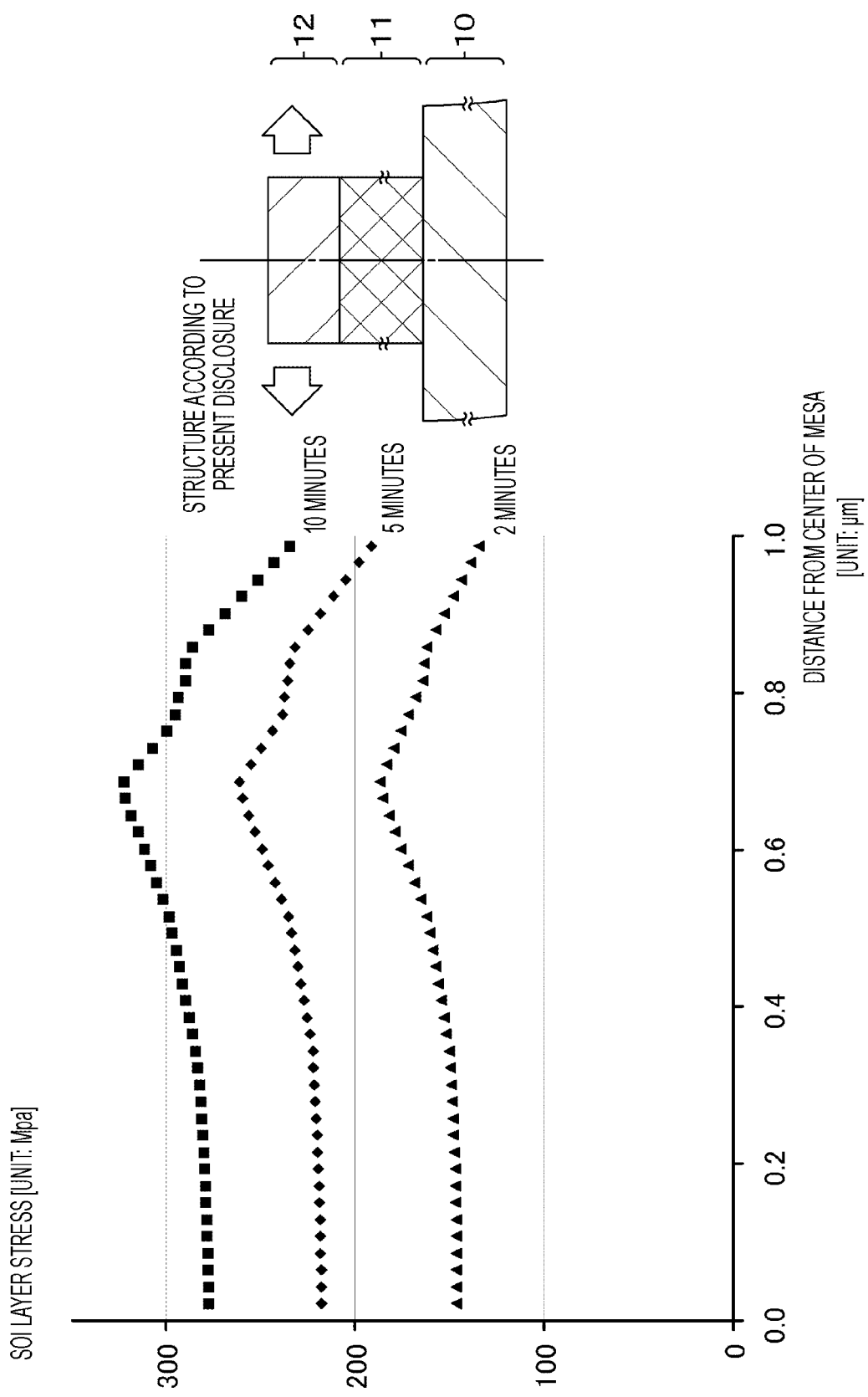
FIG. 6 is a graph of a stress simulation for explaining a relationship between a time for executing the high-temperature annealing processing and the stress of the SOI layer.

In terms of expanding the deformation remaining in the BOX layer 11, it is preferable that a processing time for executing the high-temperature annealing processing be as long as possible. With reference to FIG. 6, a relationship between the processing time for executing the high-temperature annealing processing and the stress of the SOI layer 12 will be described.

FIG. 6 is a graph illustrating the stress of the SOI layer when the time for executing the high-temperature annealing processing at the temperature of 1200° C. is ten minutes, five minutes, and two minutes in the structure according to the present disclosure. A thickness of the SOI layer is 30 nanometers, a thickness of the BOX layer 11 is 400 nanometers, and the mesa structure has a rectangular shape of which a length of one side is two micrometers.

A horizontal axis of the graph indicates a distance from the center of the mesa structure, and a vertical axis of the graph indicates the stress of the SOI layer 12. As apparent from the graph illustrated in FIG. 6, it is understood that the time for executing the high-temperature annealing processing and the stress of the SOI layer 12 have a relationship such that the longer the time for executing the high-temperature annealing processing is, the larger the stress of the SOI layer 12 is.

Figure 7:
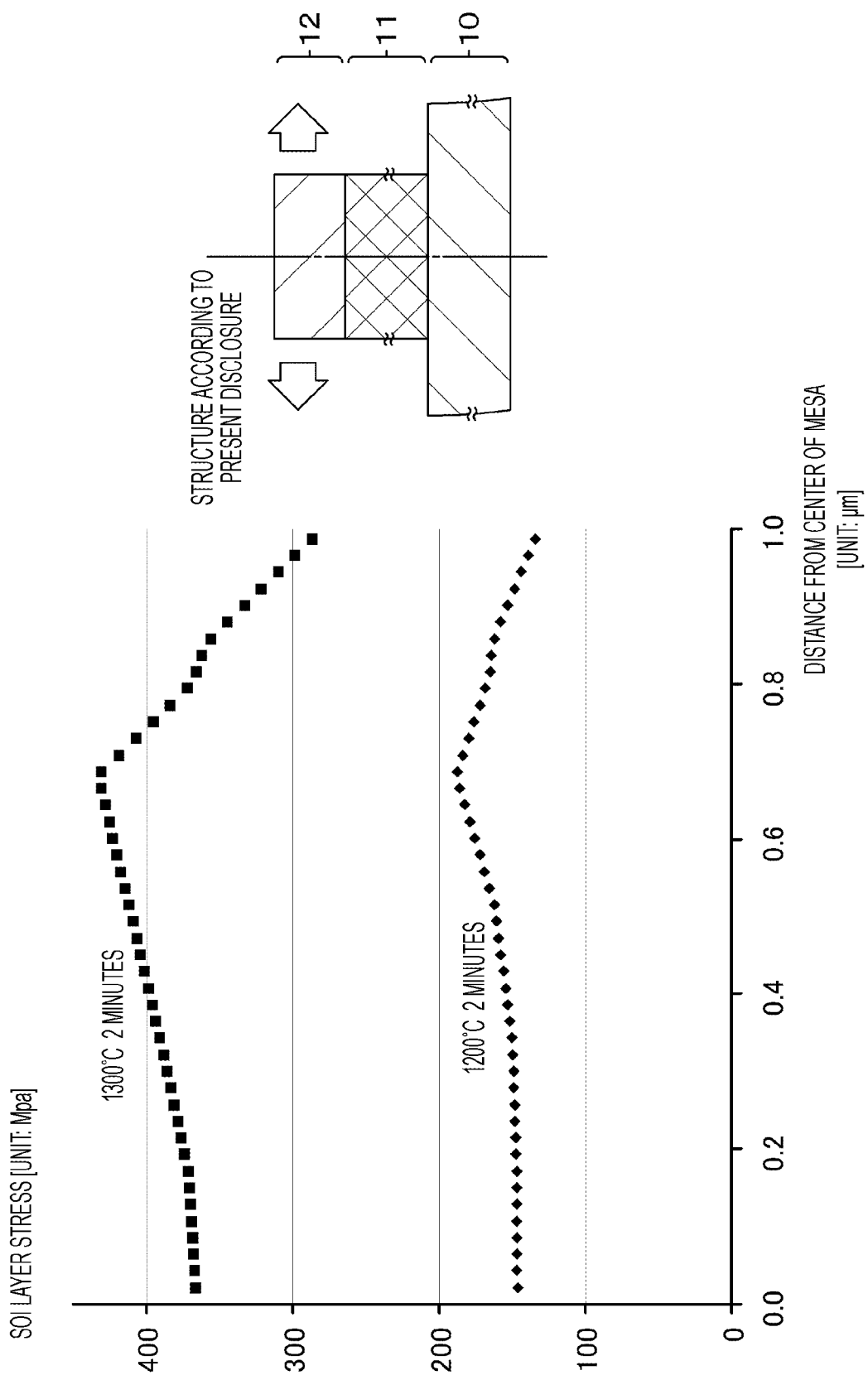
FIG. 7 is a graph of a stress simulation for explaining a relationship between a temperature at which the high-temperature annealing processing is executed and the stress of the SOI layer.

Furthermore, from the viewpoint of expanding the deformation remaining in the BOX layer 11, it is preferable that the temperature at the time of the high-temperature annealing processing be higher. With reference to FIG. 7, a relationship between the temperature when the high-temperature annealing processing is executed and the stress of the SOI layer 12 will be described.

FIG. 7 is a graph illustrating the stress of the SOI layer when the high-temperature annealing processing is executed for two minutes at the temperature of 1300° C. and the stress of the SOI layer when the high-temperature annealing processing is executed for two minutes at the temperature of 1200° C. in the structure according to the present disclosure. A thickness of the SOI layer 12 is 30 nanometers, a thickness of the BOX layer 11 is 400 nanometers, and the mesa structure has a rectangular shape of which a length of one side is two micrometers.

A horizontal axis of the graph indicates a distance from the center of the mesa structure, and a vertical axis of the graph indicates the stress of the SOI layer. As apparent from the graph illustrated in FIG. 7, it is understood that the time for executing the high-temperature annealing processing and the stress of the SOI layer 12 have a relationship such that the higher the temperature at which the high-temperature annealing processing is executed is, the larger the stress of the SOI layer 12 is.

The relationship between the processing time and the temperature of the high-temperature annealing processing and the stress of the SOI layer has been described above. Next, a relationship between the thickness and the stress of the SOI layer will be described.

As the SOI layer 12 becomes thicker, the stress is distributed. Therefore, it is desirable that the SOI layer 12 is qualitatively thin to some extent.

Figure 8:
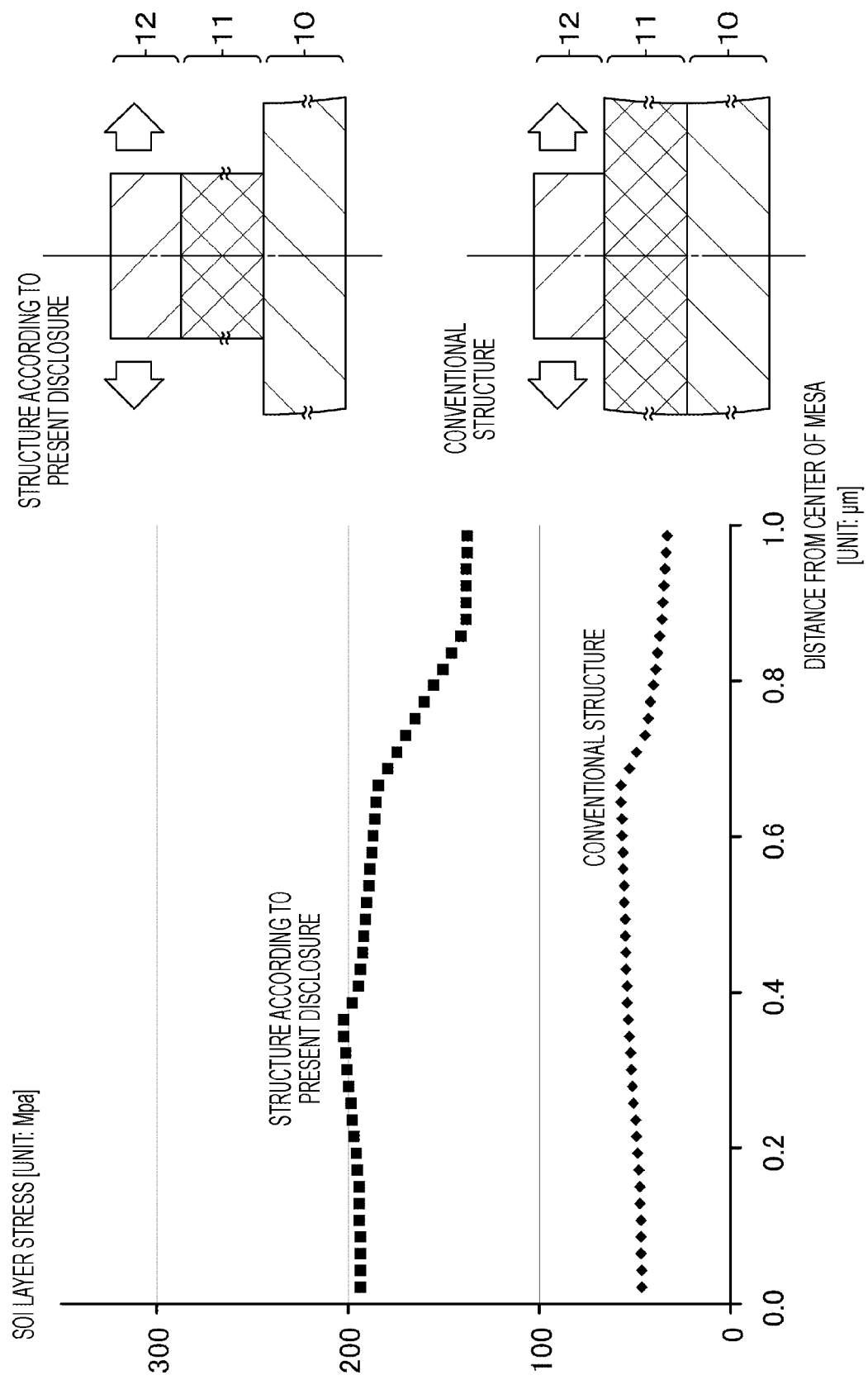
FIG. 8 is a graph corresponding to FIG. 5 and is a graph of a stress simulation for explaining the stress difference of the SOI layers caused by the difference in the mesa structure in a case where the SOI layer is thickened.

FIG. 8 is a graph corresponding to FIG. 5 and is a graph for explaining the stress difference of the SOI layers caused by the difference in the mesa structure in a case where the SOI layer is thickened. Specifically, the thickness of the SOI layer 12 is 150 nanometers, the thickness of the BOX layer 11 is 400 nanometers, and the mesa structure has a rectangular shape of which a length of one side is two micrometers. The condition of the high-temperature annealing processing includes the temperature of 1200° C. for two minutes.

In this case, the stress of the SOI layer 12 in the structure according to the present disclosure is a value equal to or more than three times of the stress in the conventional structure. However, in comparison with FIG. 5, the stress of the SOI layer 12 is slightly decreased. In terms of securing the stress of the SOI layer 12 to some extent, it is preferable that the thickness of the SOI layer 12 in the active area be equal to or less than 200 nanometers.

The relationship between the thickness and the stress of the SOI layer has been described above. Next, the thickness of the BOX layer 11 and an etching processing amount applied to the BOX layer 11 will be described.

As the BOX layer 11 becomes thinner, the effect caused by the restriction of the substrate 10 increases, and the deformation caused by the high-temperature annealing processing is suppressed. Basically, it is preferable that the thickness of the BOX layer 11 be equal to or thicker than 100 nanometers.

Furthermore, with a configuration in which the BOX layer 11 is partially etched, for example, when the mesa structure is formed, a predetermined effect can be obtained.

Figure 9:
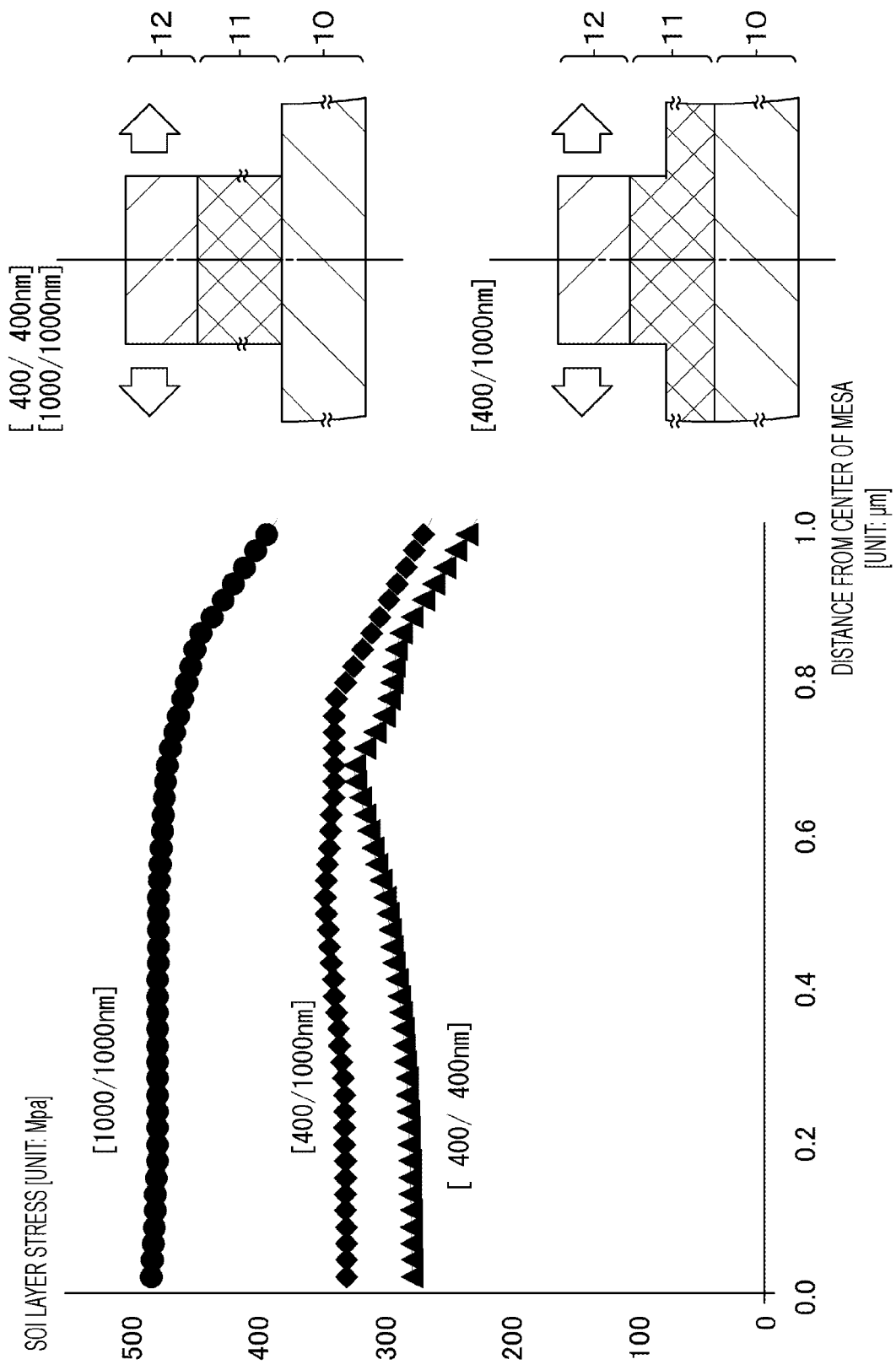
FIG. 9 is a graph of a stress simulation for explaining a relationship between a film thickness of the BOX layer and a removal amount of the BOX layer and the stress of the SOI layer.

FIG. 9 is a graph for explaining a relationship between the film thickness of the BOX layer and a removal amount of the BOX layer and the stress of the SOI layer.

In FIG. 9, the stress of the SOI layer 12 is illustrated which is generated when the high-temperature annealing processing is executed for ten minutes at the temperature of 1200° C. with the configuration according to the present disclosure such as a configuration in which the thickness of the BOX layer 11 is 400 nanometer and the entire BOX layer 11 has been removed in the mesa structure (expressed as [400/400 nm]), a configuration in which the thickness of the BOX layer 11 is 1000 nanometers and the entire BOX layer 11 has been removed in the mesa structure (expressed as [1000/1000 nm]), and a configuration in which the thickness of the BOX layer 11 is 1000 nanometers and the BOX layer 11 has been removed by 400 nanometers in the mesa structure (expressed as [400/1000 nm]).

In a case where the entire BOX layer 11 is removed, it is understood from the graph that the stress in a case where the thickness of the BOX layer 11 is 1000 nanometers is higher than the stress in a case where the thickness of the BOX layer 11 is 400 nanometers. This indicates that, as the BOX layer 11 becomes thicker, the effect caused by the restriction of the substrate 10 decreases, and the deformation caused by the high-temperature annealing processing is facilitated.

Furthermore, the stress in the configuration in which the thickness of the BOX layer 11 is 1000 nanometers and the BOX layer 11 has been removed by 400 nanometers [400/1000 nm] is larger than the stress in the configuration in which the thickness of the BOX layer 11 is 400 nanometers and all the BOX layers 11 have been removed [400/400 nm]. This is because the effect caused by the restriction of the substrate 10 is relaxed since the BOX layer 11 remains under the etched area.

In a case of the configuration in which the BOX layer 11 is partially etched, it is preferable that a difference from the thickness of the BOX layer 11 positioned in the non-active area adjacent to the active area, in other words, a difference between the thicknesses of the BOX layer 11 in the mesa structure portion and other portion be equal to or more than 50 nanometers.

Note that the etching processing in a case of the mesa structure can be executed beyond the BOX layer 11, in other words, the substrate 10 side of the BOX layer 11 can be etched.

The semiconductor device having the above structure can be used for various electronic apparatuses. For example, the semiconductor device can be applied to a display, an image sensor, a memory, an RF switch, a power amplifier, a low noise amplifier, or the like.

Subsequently, the semiconductor device according to the first aspect of the present disclosure and the method for manufacturing the semiconductor device will be described.

Figure 13A:
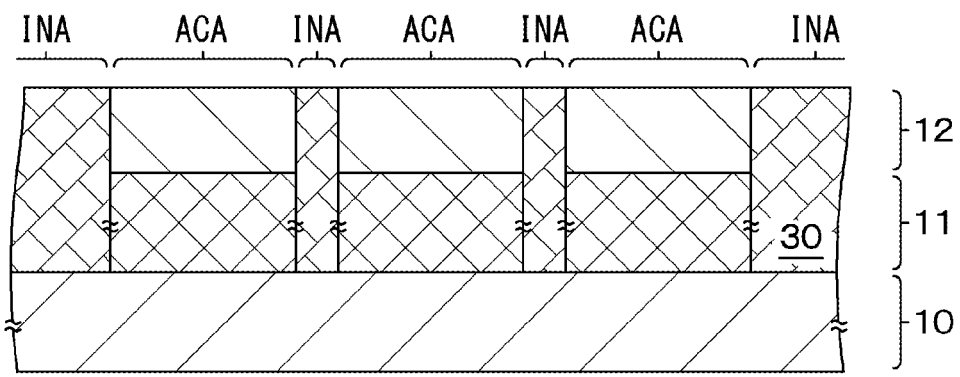
FIGS. 13A to 13C are schematic cross-sectional views for explaining the method for manufacturing the semiconductor device, subsequent to FIG. 12B.
Figure 13B:
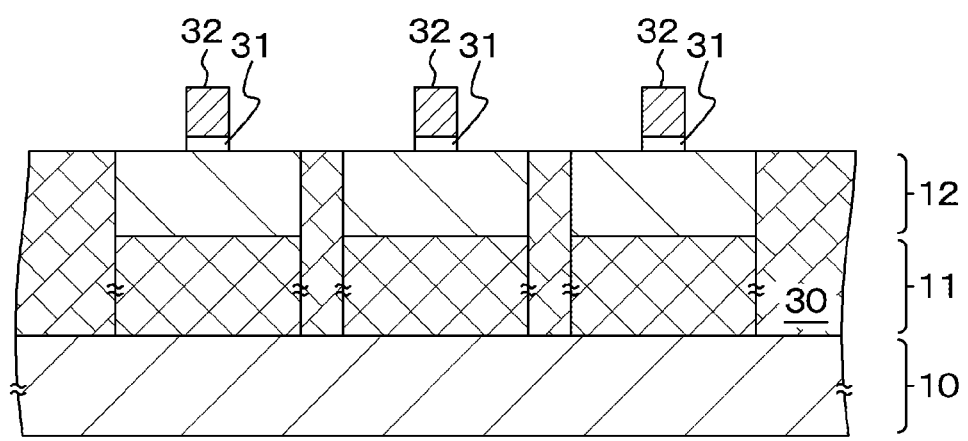
Figure 13C:
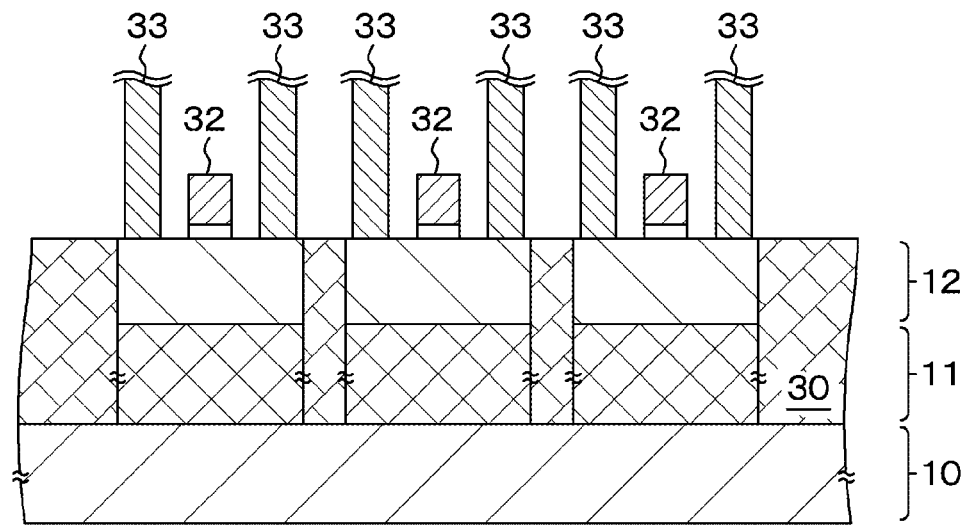

The semiconductor device according to the first embodiment illustrated in FIG. 13C and the like as described layer is a semiconductor device formed by using the SOI substrate 1 including the substrate 10, the BOX layer 11 formed on the substrate 10, and the SOI layer 12 formed on the BOX layer 11, in which a part of or all of the BOX layer 11 in at least a part of the BOX layer 11 arranged in the non-active area adjacent to the active area has been removed, and the BOX layer 11 in a portion where the SOI layer 12 forming the active area is arranged is configured to remain the deformation used to apply the stress to the SOI layer 12.

The method for manufacturing the semiconductor device according to the first embodiment is a method for manufacturing the semiconductor device formed by using the SOI substrate 1 including the substrate 10, the BOX layer 11 formed on the substrate 10, and the SOI layer 12 formed on the BOX layer 11, which includes processes for forming the stress film 20 on the SOI layer 12, subsequently removing the stress film 20 and the SOI layer 12 positioned in the non-active area adjacent to the active area, subsequently removing a part or all of the BOX layer 11 in at least a part of the BOX layer 11 arranged in the non-active area adjacent to the active area, subsequently removing the stress film 20 after the high-temperature annealing processing is executed on the entire SOI substrate 1 to generate the creep in the BOX layer 11 by the stress of the stress film 20 so as to remain the deformation caused by the creep in the BOX layer 11.

FIGS. 10 to 13 are schematic cross-sectional views for explaining the method for manufacturing the semiconductor device according to the first embodiment.

Figure 10A:
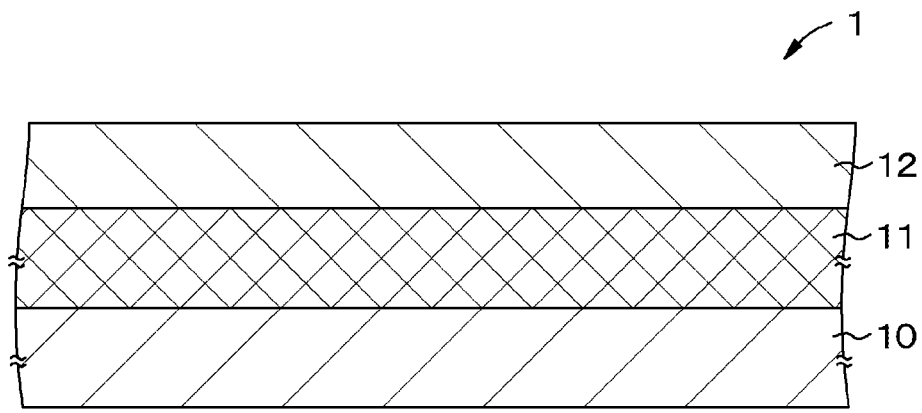
FIGS. 10A to 10C are schematic cross-sectional views for explaining a method for manufacturing a semiconductor device according to a first embodiment.
Figure 10B:
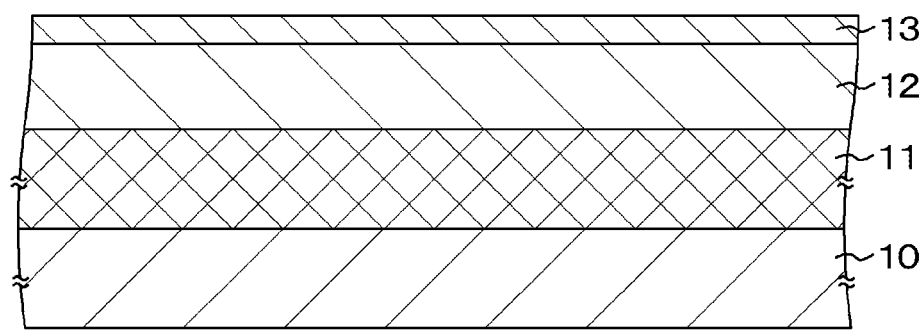
Figure 10C:
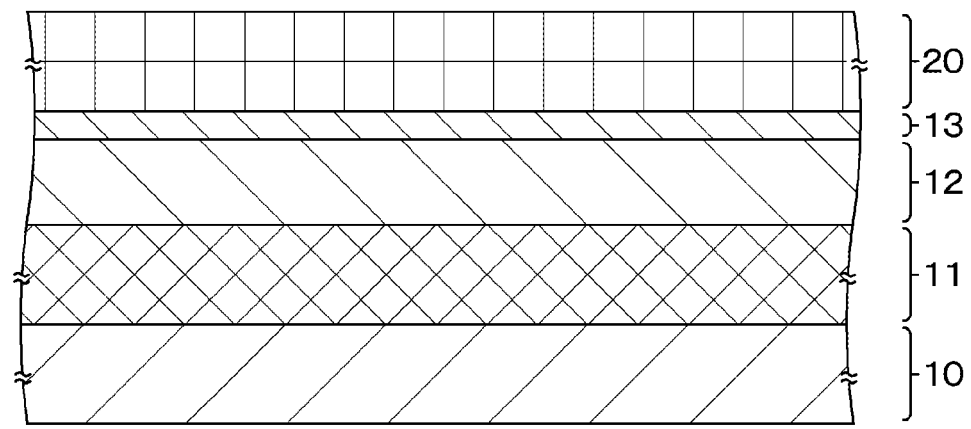

[Step-100] (refer to FIGS. 10A to 10C)

The SOI substrate 1 which includes the substrate 10, the BOX layer 11 formed on the substrate 10, and the SOI layer 12 formed on the BOX layer 11 is prepared (refer to FIG. 10A), and the SOI substrate 1 is thermally oxidized to form an oxide film 13 on the surface of the SOI layer 12 (refer to FIG. 10B). Next, by depositing a mask at the time of element isolation etching and silicon nitride to be an etching stopper at the time of planarization on the oxide film 13, the stress film 20 is formed (refer to FIG. 10C).

Basically, it is sufficient that when the nMOS type transistor is formed, the stress film 20 having the stress in a compression direction be formed, and when the pMOS type transistor is formed, the stress film 20 having the stress in a tensile direction be formed. As described above, the stress and the direction of the stress film 20 the stress can be adjusted by a type of a film formation method, atmosphere at the time of forming the film, exposure by energy rays, setting of a hydrogen density in the film, and the like.

Figure 11A:
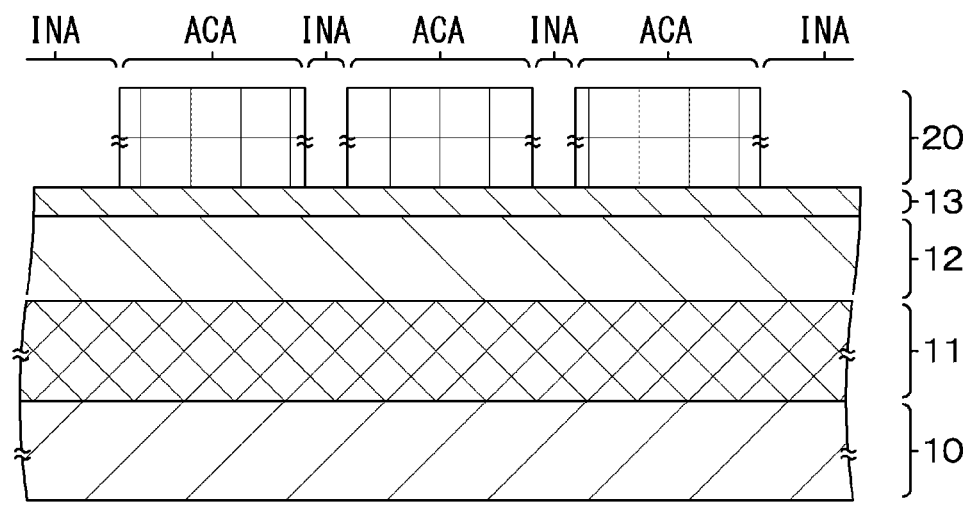
FIGS. 11A and 11B are schematic cross-sectional views for explaining the method for manufacturing the semiconductor device, subsequent to FIG. 10C.
Figure 11B:
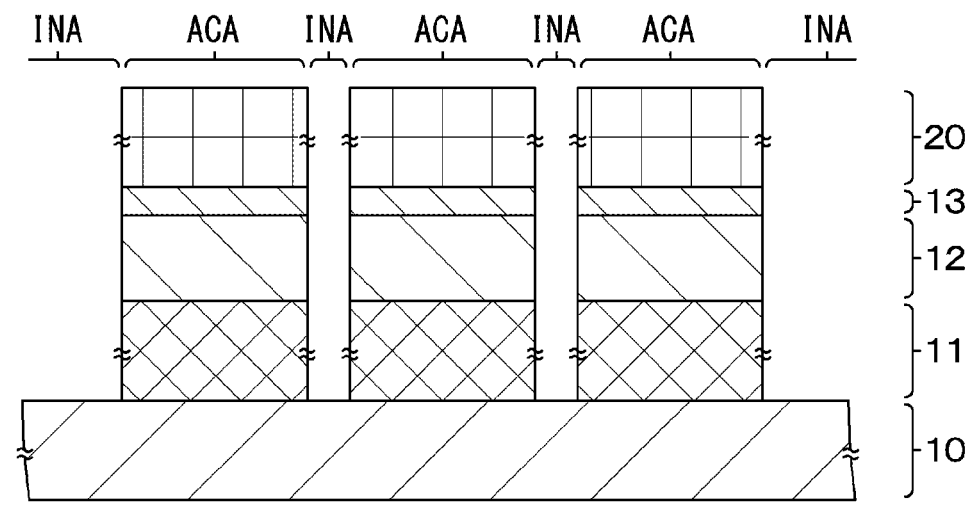

[Step-110] (refer to FIGS. 11A and 11B)

Next, the stress film 20, the oxide film 13, and the SOI layer 12 are etched, and a portion to be the mesa structure is separated. Specifically, the non-active area (indicated by reference INA) around the active area (indicated by reference ACA) is etched. The etching may be dry etching or wet etching.

First, the stress film 20 is patterned with a known method so as to correspond to the active area ACA (refer to FIG. 11A). Next, the SOI layer 12, the oxide film 13, and the BOX layer 11 are etched using the patterned stress film 20 as a mask, and the mesa structure is formed (refer to FIG. 11B). In the illustrated example, the BOX layer 11 in the non-active area INA is etched without any portion left. However, the present disclosure is not limited to this.

Note that, to apply the stress to the SOI layer 12 by the high-temperature annealing processing as described later, it is preferable that the thickness of the stress film 20 be set so that the stress film 20 having the thickness equal to or more than 50 nanometers remains at the time of mesa structure formation.

[Process-120]

Next, the high-temperature annealing processing is executed. It is sufficient that the temperature at which the high-temperature annealing processing is executed and the time in which the high-temperature annealing processing is executed be appropriately and preferably set according to the specification of the semiconductor device. Basically, it is preferable to execute processing at a temperature equal to or higher than 1100° C. for one minute or longer. Since the deformation caused by the high-temperature annealing processing is similar to the content described with reference to FIGS. 4A to 4C, the description thereof will be omitted.

Figure 12A:
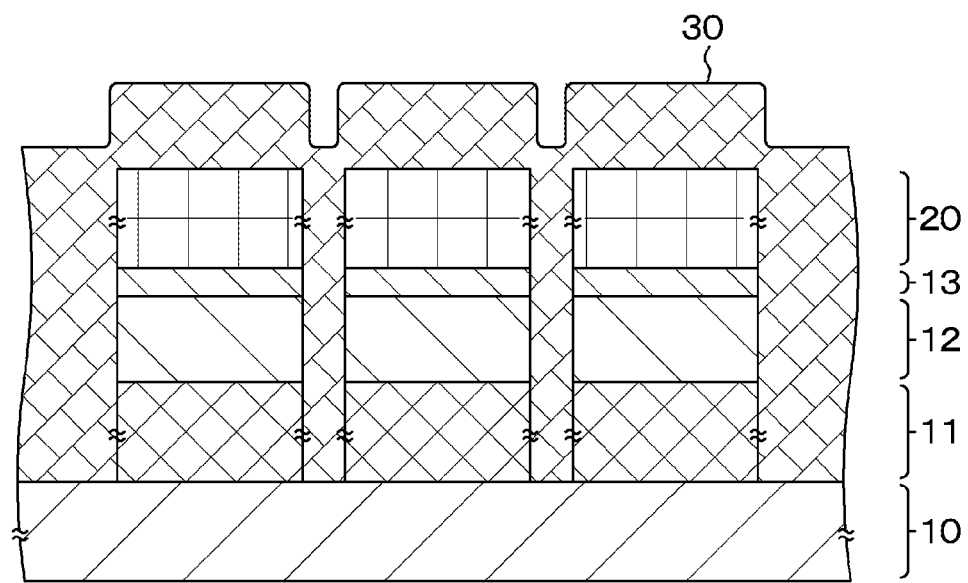
FIGS. 12A and 12B are schematic cross-sectional views for explaining the method for manufacturing the semiconductor device, subsequent to FIG. 11B.
Figure 12B:
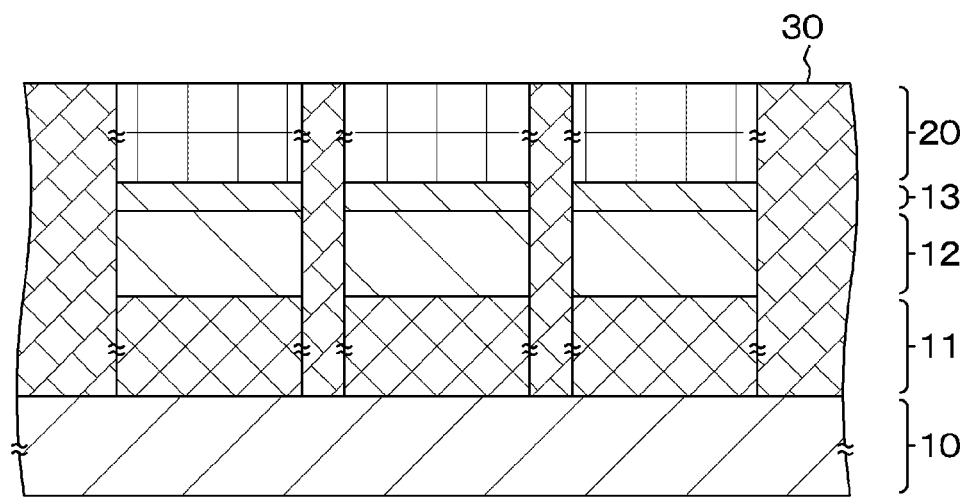

[Step-130] (Refer to FIGS. 12A, 12B, and 13A)

Thereafter, for example, an element separation insulating layer 30 is formed by using, the High Density Plasma (HDP) method or the like (refer to FIG. 12A).

Next, planarization is performed. For example, processing such as etching is executed using the stress film 20 as a stopper (refer to FIG. 12B). Thereafter, the planarization is performed by the using, for example, the Chemical Mechanical Polishing (CMP) method, the stress film 20 and the oxide film 13 are removed, and the SOI layer 12 in the active area is exposed (refer to FIG. 13A).

[Step-140] (Refer to FIGS. 13B and 13C)

Thereafter, a transistor is formed on the SOI layer 12 in the active area. For example, it is preferable to appropriately perform a process for implanting impurities, a process for forming a gate insulating film 31 and a gate electrode 32 (refer to FIG. 13B), and a process for forming a source/drain electrode 33 (FIG. 13C). Note that, for convenience of illustration, illustrations of a flattened film, an opening provided in the flattened film, and the like are omitted.

The method for manufacturing the semiconductor device according to the first embodiment has been described above.

Note that, if necessary, a process for removing a part of the substrate 10 in at least a part of the substrate surface positioned in the area formed by removing the entire BOX layer 11 may be further included.

In a case where the nMOS type transistor and the pMOS type transistor mixedly exist, it is sufficient that the stress film 20 having the compression stress be formed on the SOI layer 12 in the active area forming the nMOS type transistor and that the stress film 20 having the tensile stress be formed on the SOI layer 12 in the active area forming the pMOS type transistor. The stress film 20 can be appropriately formed at a necessary portion with a known patterning method.

Alternatively, in a case where the nMOS type transistor and the pMOS type transistor mixedly exist and, for example, it is required to cause an electrical difference between the nMOS type transistor and the pMOS type transistor, for example, a configuration can be considered in which one of the nMOS type transistor and the pMOS type transistor does not have a mesa structure. Furthermore, by applying the present disclosure at only a specific portion in the same wafer surface, and effect such that warpage of the wafer is relaxed can be obtained.

Note that, the etching of the BOX layer 11 is not necessarily made to be perpendicular to the active area. For example, a shape entering below the SOI layer 12 or a shape expanding outward may be used.

Next, a layout of the semiconductor device according to the present disclosure will be described.

Figure 14A:
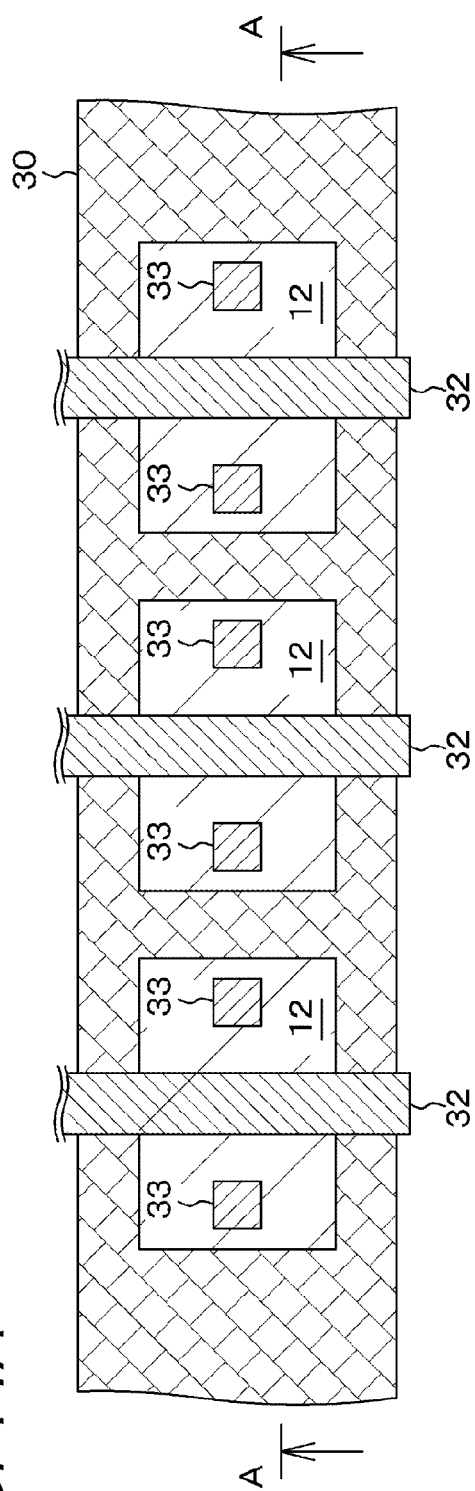
FIG. 14A is a schematic plan view for explaining a structure of a semiconductor device having a configuration in which the mesa structure is provided within the SOI layer.
Figure 14B:
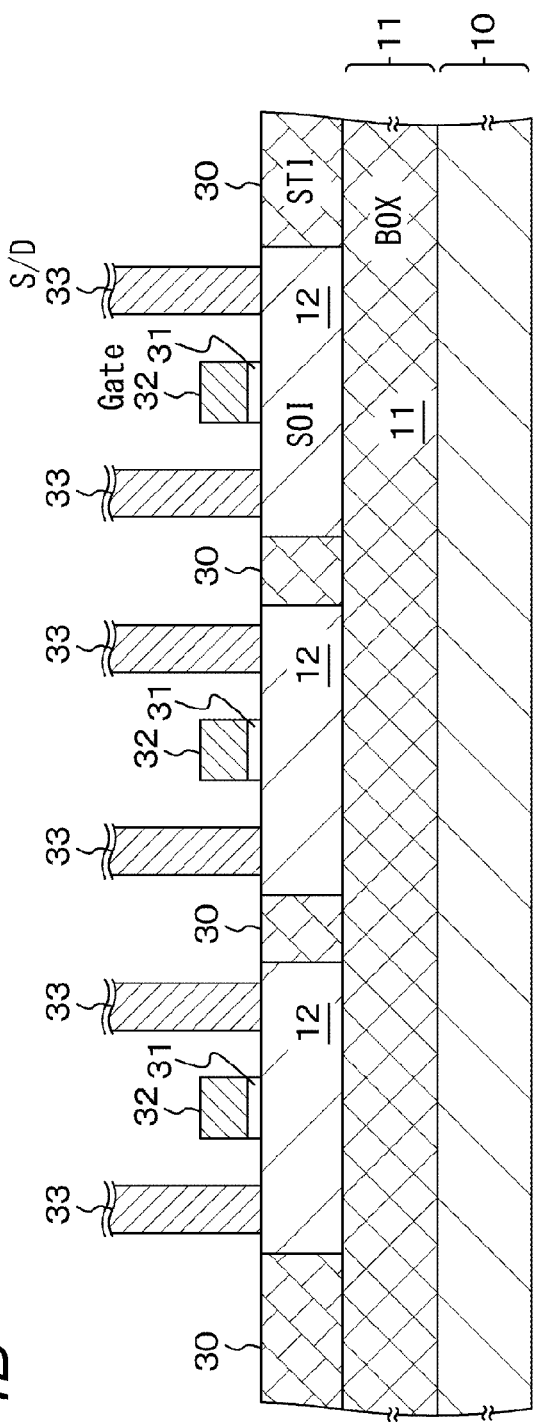
FIG. 14B is a cross-sectional view taken along an A-A line in FIG. 14A.

FIG. 14A is a schematic plan view for explaining a structure of the semiconductor device having a configuration in which the mesa structure is provided within the SOI layer. FIG. 14B is a cross-sectional view taken along an A-A line in FIG. 14A.

In the conventional structure in which the mesa structure is formed by etching only the SOI layer 12, as illustrated in FIG. 14, the film thickness of the BOX layer 11 in the wafer surface is uniform. Whereas, in the structure according to the present disclosure in which the etching is performed to the BOX layer 11, the film thickness of the BOX layer 11 in the wafer plane is not uniform.

Figure 15A:
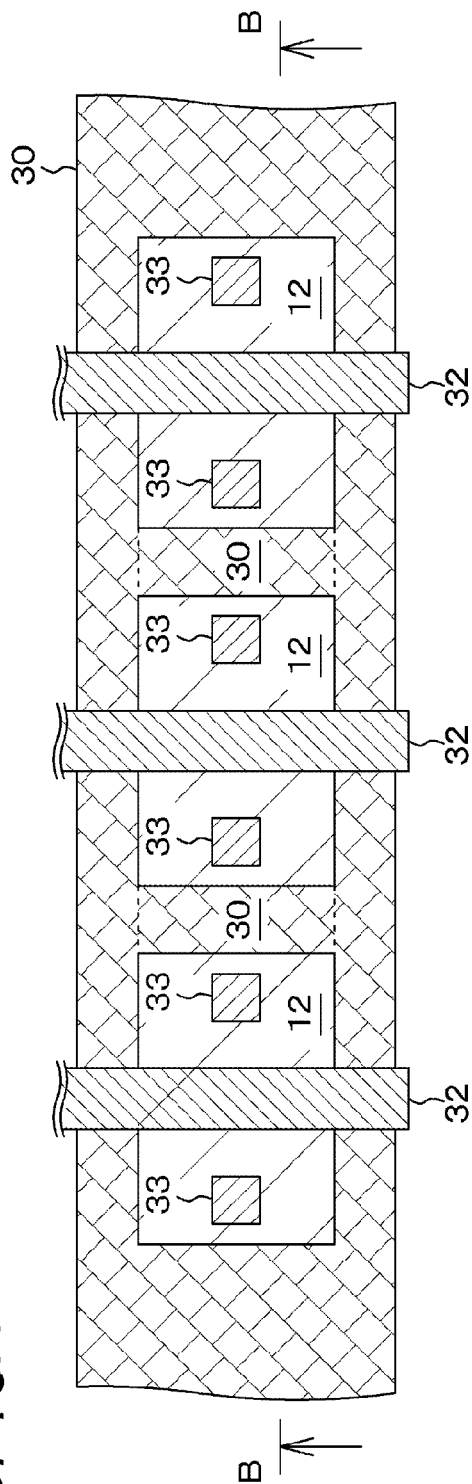
FIG. 15A is a schematic plan view for explaining a structure of a semiconductor device having a configuration in which a BOX layer is removed from a part of a non-active area.
Figure 15B:
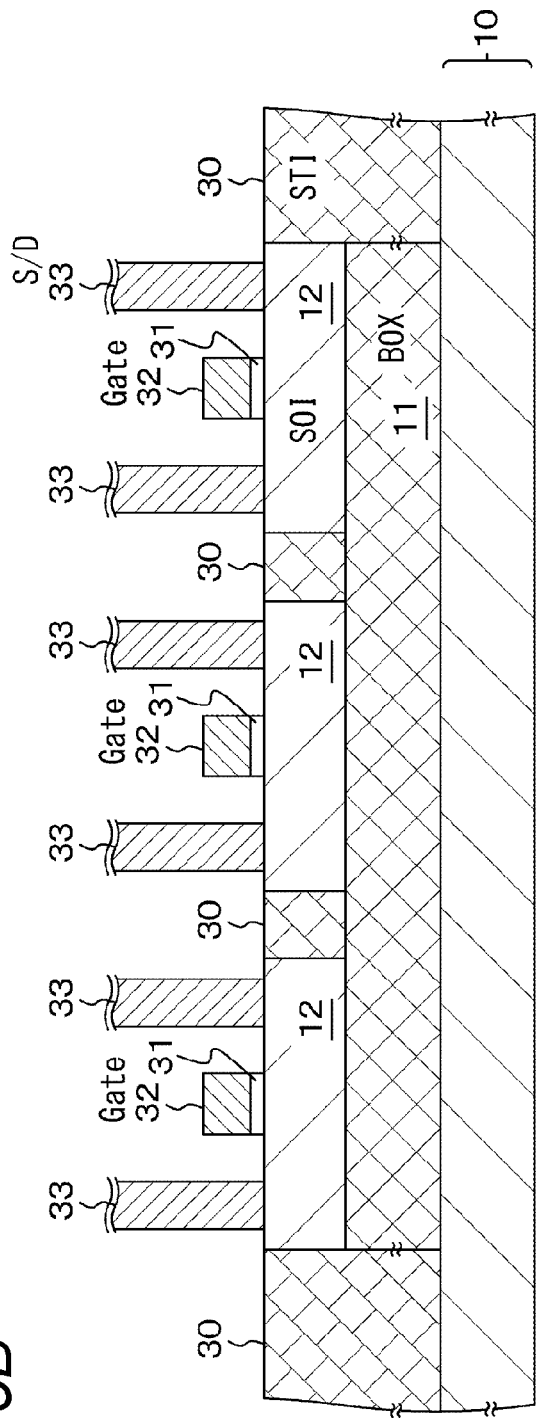
FIG. 15B is a cross-sectional view taken along a B-B line in FIG. 15A.

FIG. 15A is a schematic plan view for explaining a structure of a semiconductor device having a configuration in which the BOX layer is removed in a part of the non-active area. FIG. 15B is a cross-sectional view taken along a B-B line in FIG. 15A.

Figure 16A:
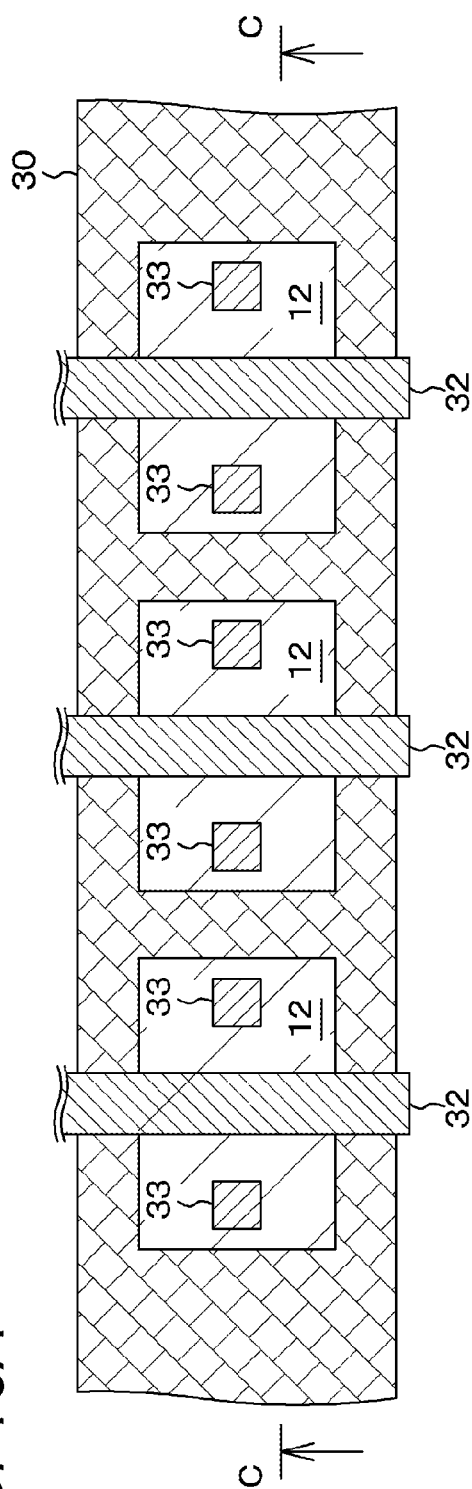
FIG. 16A is a schematic plan view for explaining a structure of a semiconductor device having a configuration in which the BOX layer is removed from all the non-active areas.
Figure 16B:
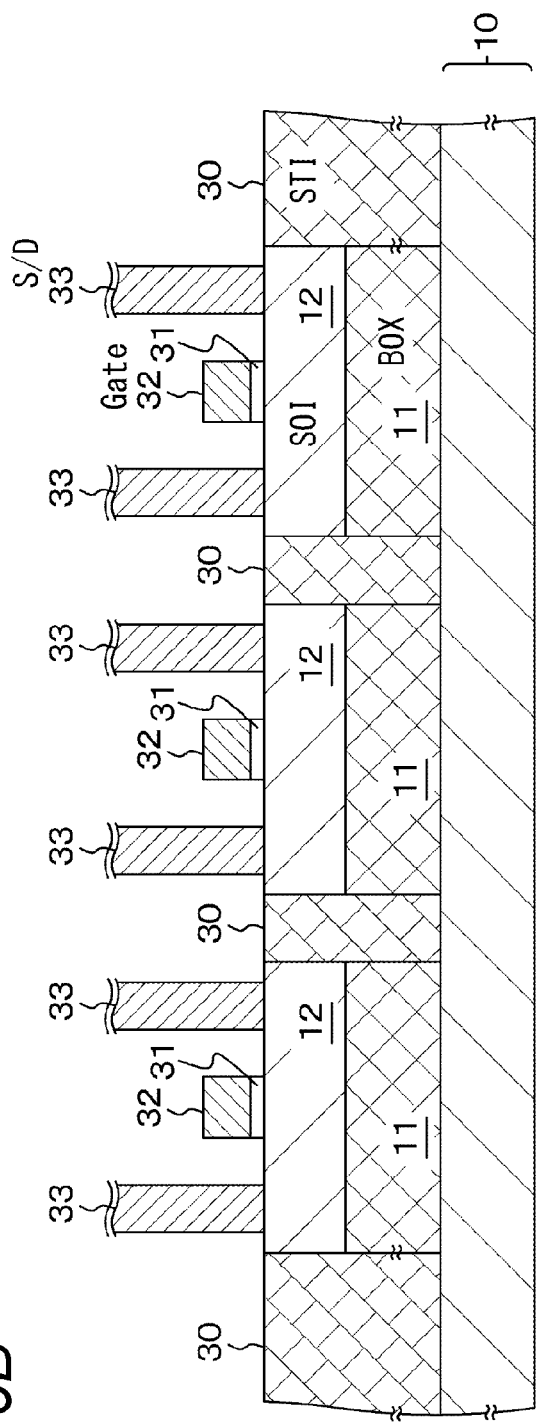
FIG. 16B is a cross-sectional view taken along a C-C line in FIG. 16A.

In the other drawings as described later, the element separation insulating layer 30 is provided so as to cover the entire surface including the BOX layer 11 of the non-active area. FIG. 15 illustrates an example of a structure in which the all the BOX layer around a group of three active areas is removed and the BOX layers between the active areas remain. The BOX layer positioned in the non-active area includes a plurality of areas having different thicknesses. FIG. 16 illustrates an example of a structure in which all the BOX layer around the group of three active areas is removed and all the BOX layers between the active areas are removed. As illustrated in these drawings, in the structure according to the present disclosure, a part of the BOX layer 11 is replaced with the element separation insulating layer 30.

Here, a relationship between the stress of the SOI layer and the area of the mesa structure will be described.

FIG. 17 is a schematic graph for explaining the relationship between the stress of the SOI layer and the area of the mesa structure. FIG. 17 is a graph illustrating the stress of the SOI layer when the high-temperature annealing processing is executed at the temperature of 1200° C. for two minutes with different areas of the mesa structure in the structure according to the present disclosure described above. The thickness of the SOI layer 12 is 30 nanometers, and the thickness of the BOX layer 11 is 400 nanometers. The mesa structures have a rectangular shape of which a length of one side is two micrometers, a rectangular shape of which a length of one side is four micrometers, and a rectangular shape of which a length of one side is 30 micrometers and a length of other side is 160 micrometers.

As apparent from the graph, the tendency is found such that, the smaller the area of the mesa structure is, more specifically, the narrower the width of a channel area in a channel length direction is, the larger a value of the stress remaining in the SOI layer 12 is. This is because, the deformation caused by the creep of the BOX layer 11 is facilitated as the area of the mesa structure decreases. Therefore, it is preferable that the width of the active area in the channel length direction be equal to or less than 30 micrometers.

From the above description, basically, a configuration in which all the BOX layer 11 arranged in the non-active area adjacent to the active area is removed, in other words, the configuration in FIG. 16 in which the BOX layer 11 is etched so as to subdivide the active area is preferable. For example, in a case where the present disclosure is applied to a multi-gate type transistor having a long total W length and the like, a more significant effect can be obtained by etching the BOX layer next to each source/drain.

Figure 18A:
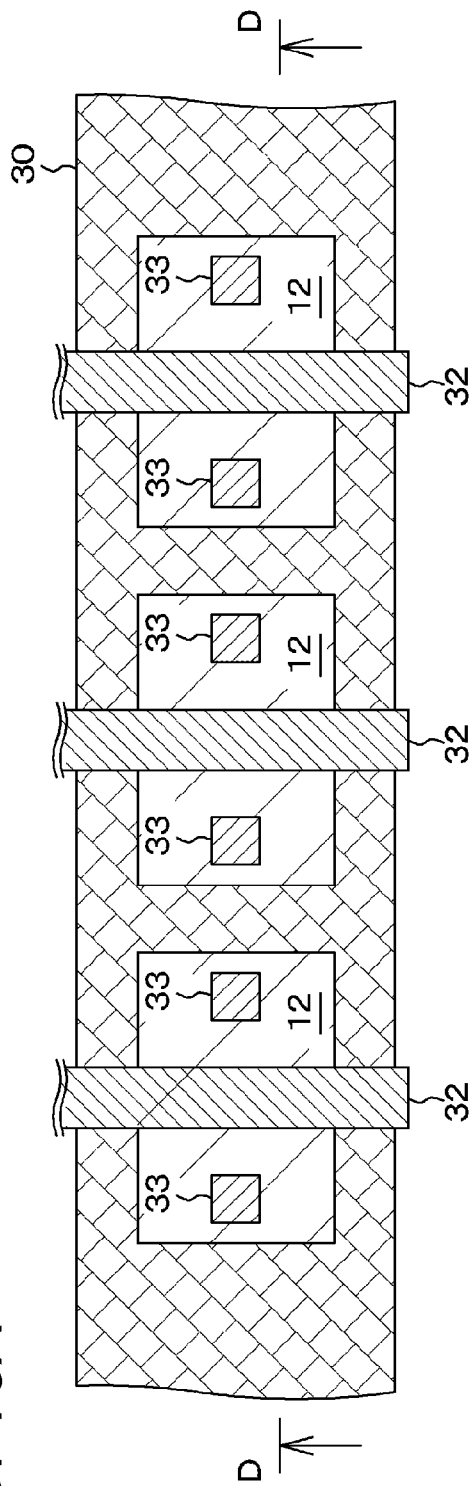
FIG. 18A is a schematic plan view for explaining a configuration of a semiconductor device having a structure in which the BOX layer is partially removed in all the non-active areas.
Figure 18B:
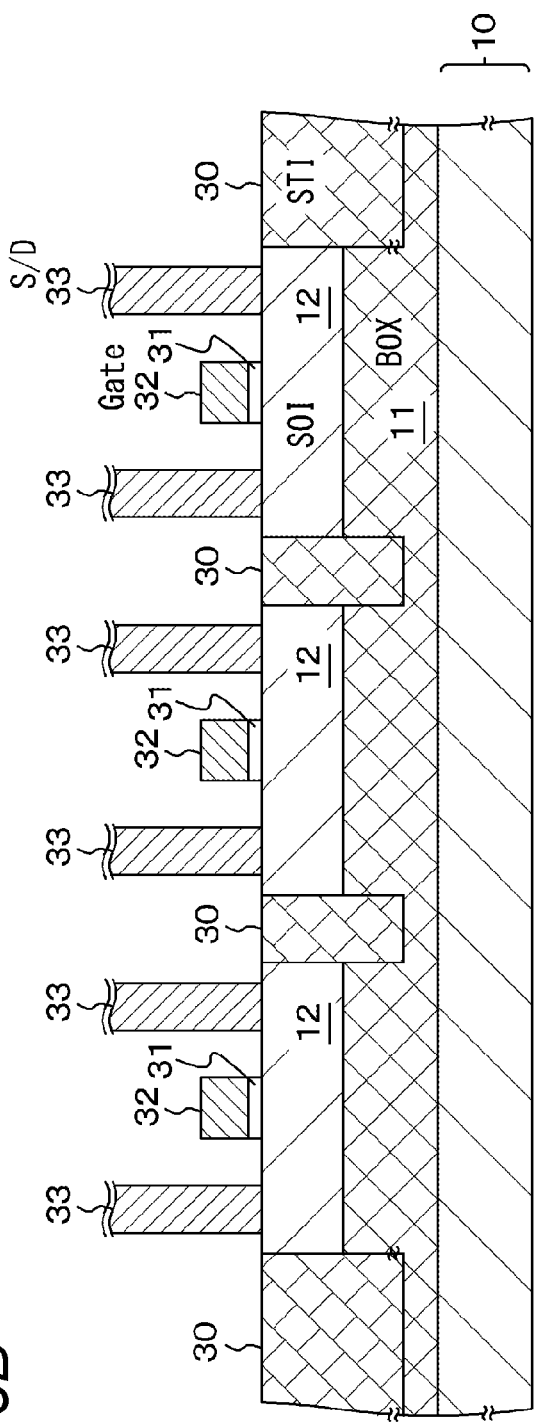
FIG. 18B is a cross-sectional view taken along a D-D line in FIG. 18A.

Note that the etching may be performed to the middle of the BOX layer 11. FIG. 18A is a schematic plan view for explaining a structure of a semiconductor device having a configuration in which the BOX layer is partially removed in all the non-active areas. FIG. 18B is a cross-sectional view taken along a D-D line in FIG. 18A.

The structure illustrated in FIG. 18 is a structure in which the film thickness of the BOX layer in the active area is different from the film thickness of the BOX layer in the non-active area.

Figure 19A:
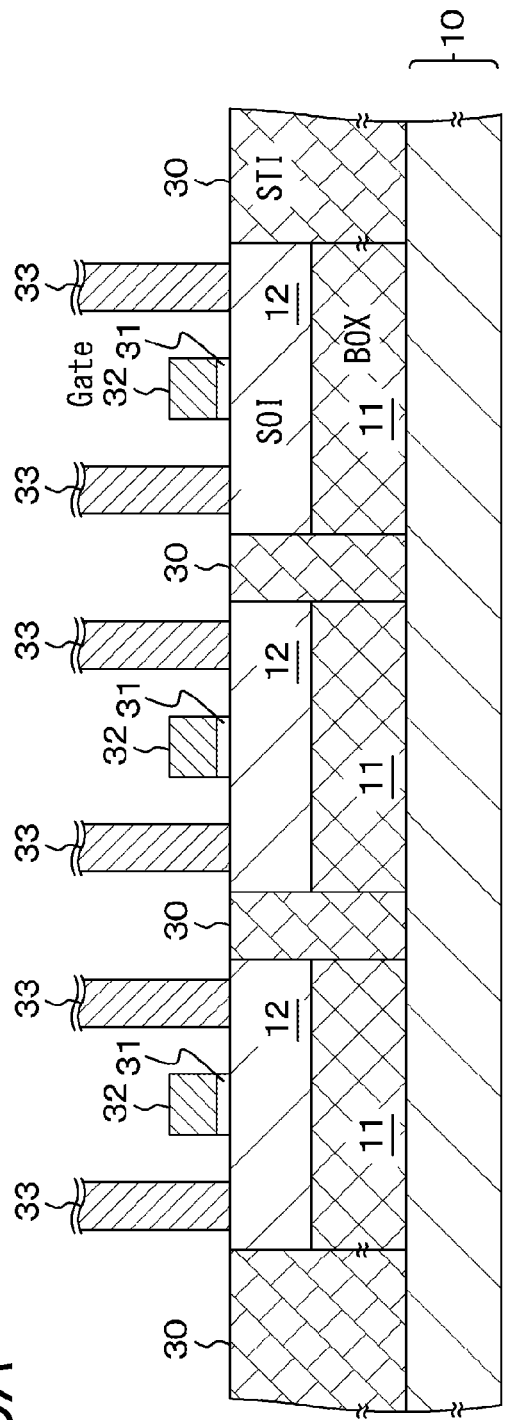
FIGS. 19A and 19B are schematic cross-sectional views for explaining a structure of a semiconductor device in which a configuration from which the entire BOX layer has been removed is mixed with a configuration in which the BOX layer has been partially removed.
Figure 19B:
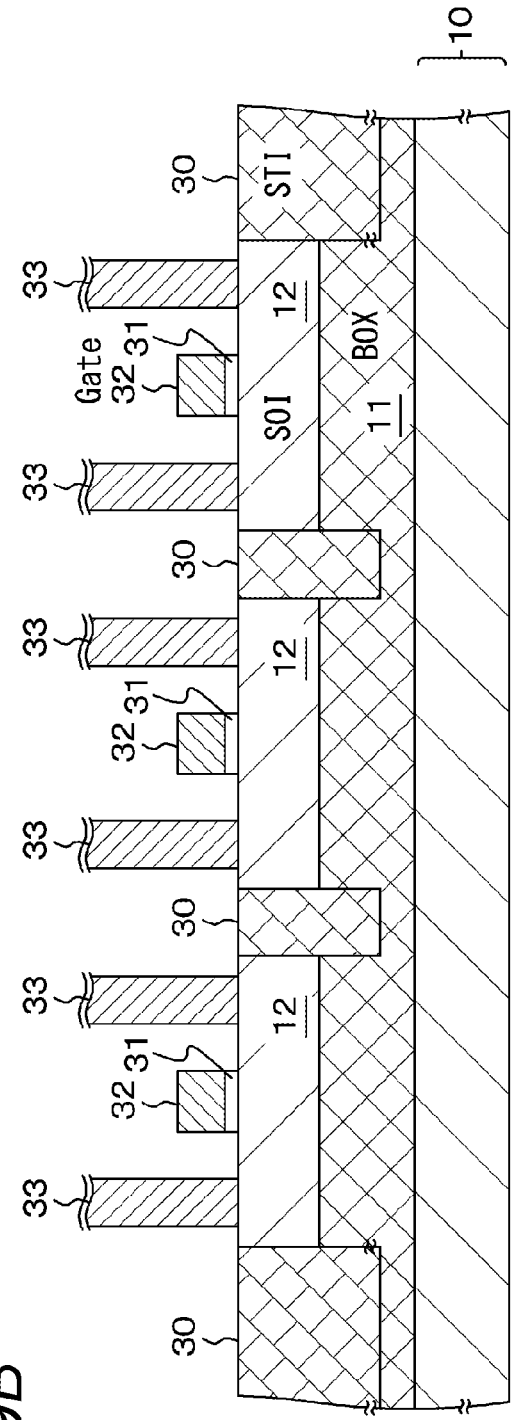

Note that a configuration can be used in which the BOX layer 11 positioned in the non-active area includes a plurality of areas having different thicknesses. For example, a configuration in which the entire BOX layer 11 is removed in a specific portion in the wafer and a configuration in which the BOX layer 11 is partially removed in the other specific portions may mixedly exist. FIGS. 19A and 19B are schematic cross-sectional views for explaining a structure of a semiconductor device in which the configuration from which all the BOX layers 11 have been removed is mixed with the configuration in which the BOX layer 11 has been partially removed. FIG. 19A corresponds to FIG. 16B, and FIG. 19B corresponds to FIG. 18B.

For example, the semiconductor device can be configured so as to include the active area forming the nMOS type transistor and the active area forming the pMOS type transistor and have a structure in which the thickness of the BOX layer 11 positioned in the non-active area adjacent to the active area forming the nMOS type transistor is different from the thickness of the BOX layer 11 positioned in the non-active area adjacent to the active area forming the pMOS type transistor.

Figure 20A:
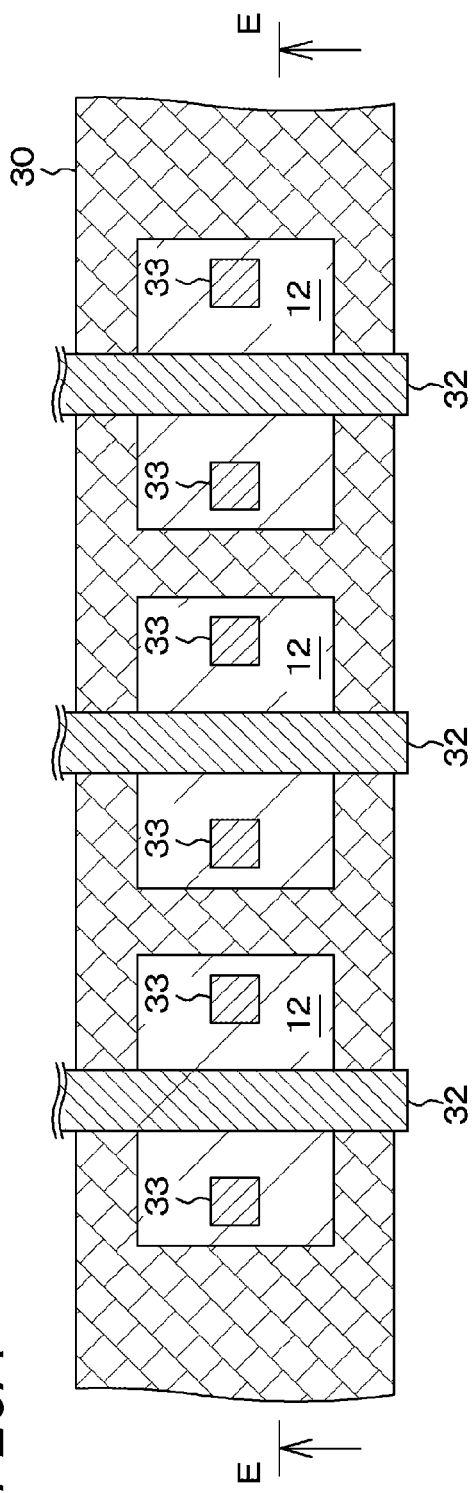
FIG. 20A is a schematic plan view for explaining a structure of a semiconductor device having a configuration in which the BOX layer has been removed from all the non-active areas and a top portion of a substrate has been partially removed.
Figure 20B:
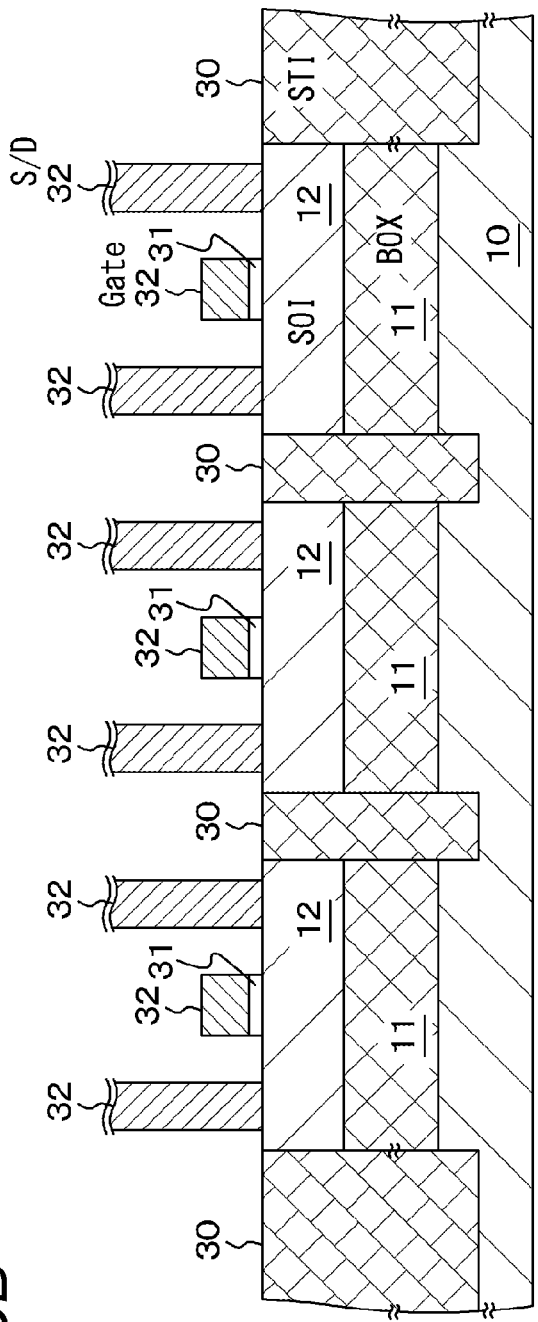
FIG. 20B is a cross-sectional view taken along an E-E line in FIG. 20A.

Furthermore, in some cases, a configuration may be used in which etching is performed to the substrate 10 under the BOX layer 11. FIG. 20A is a schematic plan view for explaining a structure of a semiconductor device having a configuration in which all the BOX layers 11 have been removed from all the non-active areas and a top portion of the substrate has been partially removed. FIG. 20B is a cross-sectional view taken along an E-E line in FIG. 20A. A part of the substrate removed in at least a part of the substrate surface positioned in an area formed by removing the entire BOX layer 11.

Note that, for example, a configuration in which all the BOX layer 11 is removed in a specific portion in the wafer and a configuration in which a part of the top portion of the substrate 10 under the BOX layer 11 is removed in the other specific portion may mixedly exist. FIGS. 21A and 21B are schematic cross-sectional views for explaining a structure of a semiconductor device in which a configuration in which all the BOX layers 11 have been removed and a part of the top portion of the substrate 10 has been further removed and other configuration mixedly exist. FIG. 21A corresponds to FIG. 19B, and FIG. 21B corresponds to FIG. 16B.

Furthermore, a configuration can be used in which each of the BOX layer 11 and the substrate 10 positioned in the non-active area includes a plurality of areas having different thicknesses. For example, the semiconductor device can have a configuration in which, in at least a part of the substrate 10 surface positioned in the area formed by removing the entire BOX layer 11, a part of the substrate 10 is removed, and the thickness of the substrate 10 positioned in the non-active area adjacent to the active area forming the nMOS type transistor is different from the thickness of the substrate 10 positioned in the non-active area adjacent to the active area forming the pMOS type transistor.

[Others]

The embodiment of the present disclosure has been specifically described above. However, the present disclosure is not limited to the above-mentioned embodiments and can be variously modified based on the technical idea of the present disclosure. For example, numerical values, structures, substrates, raw materials, processes, and the like mentioned in the above embodiment are merely examples, and numerical values, structures, substrates, raw materials, processes, and the like different from these may be used as needed.

Note that the technique according to the present disclosure can have the following configuration.

[A1]

A semiconductor device formed by using an SOI substrate including a substrate, a BOX layer formed on the substrate, and an SOI layer formed on the BOX layer, in which a part of or all of the BOX layer at least in a part of the BOX layer arranged in the non-active area adjacent to the active area has been removed, and the BOX layer in a portion where the SOI layer forming the active area is arranged is configured to remain deformation used to apply stress to the SOI layer.

[A2]

The semiconductor device according to [A1], in which the BOX layer positioned in the non-active area includes a plurality of areas having different thicknesses.

[A3]

The semiconductor device according to [A1] or [A2], in which a part of the substrate is removed in at least a part of a substrate surface positioned in an area formed by removing the entire BOX layer.

[A4]

The semiconductor device according to [A3], in which each of the BOX layer and the substrate positioned in the non-active area includes a plurality of areas having different thicknesses.

[A5]

The semiconductor device according to any one of [A1] to [A4], in which stress for expanding a crystal lattice is applied to the SOI layer in the active area forming an nMOS type transistor.

[A6]

The semiconductor device according to any one of [A1] to [A5], in which stress for narrowing the crystal lattice is applied to the SOI layer in the active area forming a pMOS type transistor.

[A7]

The semiconductor device according to any one of [A1] to [A6], in which the active area forming the nMOS type transistor and the active area forming the pMOS type transistor are included, and a thickness of the BOX layer positioned in the non-active area adjacent to the active area forming the nMOS type transistor is different from a thickness of the BOX layer positioned in the non-active area adjacent to the active area forming the pMOS type transistor.

[A8]

The semiconductor device according to [A7], in which a part of the substrate is removed at least in a part of a substrate surface positioned in an area formed by removing the entire BOX layer, and a thickness of the substrate positioned in the non-active area adjacent to the active area forming the nMOS type transistor is different from a thickness of the substrate positioned in the non-active area adjacent to the active area forming the pMOS type transistor.

[A9]

The semiconductor device according to any one of [A1] to [A8], in which a difference between the thickness of the BOX layer positioned in the active area and the thickness of the BOX layer positioned in the non-active area adjacent to the active area is equal to or more than 50 nanometers.

[A10]

The semiconductor device according to any one of [A1] to [A8], in which all the BOX layer arranged in the non-active area adjacent to the active area removed.

[A11]

The semiconductor device according to any one of [A1] to [A10], in which the BOX layer in a portion where the SOI layer forming the active area is arranged is configured so that deformation caused by a creep generated by high-temperature annealing processing executed on the SOI substrate remains.

[A12]

The semiconductor device according to any one of [A1] to [A11], in which stress over 100 MPa at a normal temperature is applied to the SOI layer on the BOX layer in the active area.

[A13]

The semiconductor device according to any one of [A1] to [A12], in which a thickness of the SOI layer in the active area is equal to or less than 200 nanometers.

[A14]

The semiconductor device according to any one of [A1] to [A13], in which a width of the active area in a channel length direction is equal to or less than 30 micrometers.

[A15]

The semiconductor device according to any one of [A1] to [A14], in which an element separation insulating layer is provided in the non-active area so as to cover an entire surface including the BOX layer.

[B1]

A method for manufacturing a semiconductor device formed by using an SOI substrate including a substrate, a BOX layer formed on the substrate, and an SOI layer formed on the BOX layer, including processes for:

forming a stress film on the SOI layer;

subsequently removing the stress film and the SOI layer positioned in a non-active area adjacent to an active area;

subsequently removing a part or all of the BOX layer at least in a part of the BOX layer arranged in the non-active area adjacent to the active area; and subsequently removing the stress film after high-temperature annealing processing is executed on the entire SOI substrate to generate a creep in the BOX layer by stress of the stress film so as to remain deformation caused by the creep in the BOX layer.

[B2]

The method for manufacturing a semiconductor device according to [B1], further including:

a process for removing a part of the substrate in at least a part of a substrate surface positioned in an area where all the BOX layer has been removed.

[B3]

The method for manufacturing a semiconductor device according to [B1] or [B2], in which a stress film having compression stress is formed on the SOI layer in the active area forming an nMOS type transistor, and a stress film having tensile stress is formed on the SOI layer in the active area forming a pMOS type transistor.

[C1]

An electronic apparatus including a semiconductor device formed by using an SOI substrate including a substrate, a BOX layer formed on the substrate, and an SOI layer formed on the BOX layer, in which a part of or all of the BOX layer at least in a part of the BOX layer arranged in a non-active area adjacent to an active area has been removed, and the BOX layer in a portion where the SOI layer forming the active area is arranged is configured to remain deformation used to apply stress to the SOI layer.

[C2]

The electronic apparatus according to [C1], in which the electronic apparatus is a display, an image sensor, a memory, an RF switch, a power amplifier, or a low noise amplifier.

REFERENCE SIGNS LIST

1 SOI substrate
10 Substrate
11 BOX layer
12 SOI layer
13 Oxide film
20 Stress film
30 Element separation insulating layer
31 Gate insulating film
32 Gate electrode
33 Source/drain electrode
ACA Active area
INA Non-active area

What is claimed is:

1. A semiconductor device formed by using a silicon on insulator (SOI) substrate comprising:
   a substrate;
   a buried oxide (BOX) layer formed on the substrate; and
   an SOI layer formed on the BOX layer,
   wherein a part of or all of the BOX layer at least in a part of the BOX layer arranged in a non-active area adjacent to an active area has been removed,
   wherein the BOX layer in a portion where the SOI layer forming the active area is arranged is configured to remain deformed and used to apply stress to the SOI layer,
   wherein the active area forming an nMOS type transistor and the active area forming a pMOS type transistor are included,
   wherein when an entire BOX layer has been removed, a part of the substrate is removed at least a part of a substrate surface positioned in an area where the entire BOX layer has been removed, and
   wherein a thickness of the substrate position in the non-active area adjacent to the active area forming the nMOS type transistor is different from a thickness of the substrate positioned in the non-active area adjacent to the active area forming the pMOS type transistor.

2. The semiconductor device according to claim 1, wherein the BOX layer positioned in the non-active area includes a plurality of areas having different thicknesses.

3. The semiconductor device according to claim 1, wherein
   each of the BOX layer and the substrate positioned in the non-active area includes a plurality of areas having different thicknesses.

4. The semiconductor device according to claim 1, wherein
   stress for expanding a crystal lattice is applied to the SOI layer in the active area forming the nMOS type transistor.

5. The semiconductor device according to claim 1, wherein
   stress for narrowing a crystal lattice is applied to the SOI layer in the active area forming the pMOS type transistor.

6. The semiconductor device according to claim 1, wherein
   a thickness of the BOX layer positioned in the non-active area adjacent to the active area forming the nMOS type transistor is different from a thickness of the BOX layer positioned in the non-active area adjacent to the active area forming the pMOS type transistor.

7. The semiconductor device according to claim 1, wherein
   a difference between a thickness of the BOX layer positioned in the active area and a thickness of the BOX layer positioned in the non-active area adjacent to the active area is equal to or more than 50 nanometers.

8. The semiconductor device according to claim 1, wherein all the BOX layer arranged in the non-active area adjacent to the active area is removed.

9. The semiconductor device according to claim 1, wherein
   the BOX layer in a portion where the SOI layer forming the active area is arranged is configured so that deformation caused by a creep generated by high-temperature annealing processing executed on the SOI substrate remains.

10. The semiconductor device according to claim 1, wherein stress over 100 MPa at a normal temperature is applied to the SOI layer on the BOX layer in the active area.

11. The semiconductor device according to claim 1, wherein a thickness of the SOI layer in the active area is equal to or less than 200 nanometers.

12. The semiconductor device according to claim 1, wherein a width of the active area in a channel length direction is equal to or less than 30 micrometers.

13. The semiconductor device according to claim 1, wherein an element separation insulating layer is provided in the non-active area so as to cover an entire surface including the BOX layer.

14. A method for manufacturing a semiconductor device formed by using a silicon on insulator (SOI) substrate including a substrate, a buried oxide (BOX) layer formed on the substrate, and an SOI layer formed on the BOX layer, comprising processes for:
   forming a stress film on the SOI layer;
   subsequently removing the stress film and the SOI layer positioned in a non-active area adjacent to an active area;
   subsequently removing a part or all of the BOX layer at least in a part of the BOX layer arranged in the non-active area adjacent to the active area; and
   subsequently removing the stress film after high-temperature annealing processing is executed on the entire SOI substrate to generate a creep in the BOX layer by stress of the stress film,
   wherein deformation caused by the creep in the BOX layer remains.

15. The method for manufacturing a semiconductor device according to claim 14, further comprising:
   a process for removing a part of the substrate in at least a part of a substrate surface positioned in an area where all the BOX layer has been removed.

16. The method for manufacturing a semiconductor device according to claim 14, wherein
   a stress film having compression stress is formed on the SOI layer in the active area forming an nMOS type transistor, and a stress film having tensile stress is formed on the SOI layer in the active area forming a pMOS type transistor.

17. An electronic apparatus, comprising:
   a semiconductor device formed by using a silicon on insulator (SOI) substrate, comprising:
      a substrate;
      a buried oxide (BOX) layer formed on the substrate; and
      an SOI layer formed on the BOX layer,
      wherein a part of or all of the BOX layer at least in a part of the BOX layer arranged in a non-active area adjacent to an active area has been removed,
      wherein the BOX layer in a portion where the SOI layer forming the active area is arranged is configured to remain deformed and used to apply stress to the SOI layer,
      wherein the active area forming an nMOS type transistor and the active area forming a pMOS type transistor are included,
      wherein when an entire BOX layer has been removed, a part of the substrate is removed at least a part of a substrate surface positioned in an area where the entire BOX layer has been removed, and
      wherein a thickness of the substrate position in the non-active area adjacent to the active area forming the nMOS type transistor is different from a thickness of the substrate positioned in the non-active area adjacent to the active area forming the pMOS type transistor.

18. The electronic apparatus according to claim 17, wherein the electronic apparatus is a display, an image sensor, a memory, an RF switch, a power amplifier, or a low noise amplifier.

19. The electronic apparatus according to claim 17, wherein a thickness of the BOX layer positioned in the non-active area adjacent to the active area forming the nMOS type transistor is different from a thickness of the BOX layer positioned in the non-active area adjacent to the active area forming the pMOS type transistor.

20. The electronic apparatus according to claim 17, wherein a difference between a thickness of the BOX layer positioned in the active area and a thickness of the BOX layer positioned in the non-active area adjacent to the active area is equal to or more than 50 nanometers.

* * * * *